United States Patent
Tsukuda et al.

(10) Patent No.: US 12,341,503 B2
(45) Date of Patent: Jun. 24, 2025

(54) SEMICONDUCTOR DEVICE AND METHOD FOR CONTROLLING THE SAME

(71) Applicant: Mitsubishi Electric Corporation, Tokyo (JP)

(72) Inventors: Masanori Tsukuda, Tokyo (JP); Shinya Soneda, Tokyo (JP); Koichi Nishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 32 days.

(21) Appl. No.: 18/343,435

(22) Filed: Jun. 28, 2023

(65) Prior Publication Data

US 2024/0106429 A1 Mar. 28, 2024

(30) Foreign Application Priority Data

Sep. 27, 2022 (JP) ................................ 2022-153394

(51) Int. Cl.
*H03K 17/16* (2006.01)
*H10D 8/00* (2025.01)
*H10D 12/00* (2025.01)

(52) U.S. Cl.
CPC ............. *H03K 17/168* (2013.01); *H10D 8/00* (2025.01); *H10D 12/481* (2025.01)

(58) Field of Classification Search
None
See application file for complete search history.

(56) References Cited

U.S. PATENT DOCUMENTS

| 6,069,371 | A | * | 5/2000 | Omura | .................. | H01L 29/861 |
| | | | | | | 257/E29.198 |
| 8,421,184 | B2 | * | 4/2013 | Koyama | ............. | H01L 29/7397 |
| | | | | | | 257/E29.198 |
| 11,282,937 | B2 | | 3/2022 | Mori et al. | | |
| 2020/0220538 | A1 | | 7/2020 | Sakano et al. | | |
| 2021/0057537 | A1 | | 2/2021 | Mori et al. | | |

FOREIGN PATENT DOCUMENTS

| DE | 112019001054 T5 | 11/2020 |
| EP | 4071813 A1 | 10/2022 |
| JP | 6652173 B2 | 2/2020 |
| JP | 2020-109900 A | 7/2020 |
| JP | 6964538 B2 | 11/2021 |
| WO | 2021/112076 A1 | 6/2021 |

OTHER PUBLICATIONS

An Office Action issued by the German Patent and Trademark Office on Jan. 18, 2024, which corresponds to German U.S. Appl. No. 18/343,435.8 and is related to U.S. Appl. No. 18/343,435; with English language translation.

* cited by examiner

*Primary Examiner* — Cassandra F Cox
(74) *Attorney, Agent, or Firm* — Studebaker Brackett PLLC

(57) ABSTRACT

Provided is a semiconductor device that is easily controlled. The semiconductor device includes a first switching device and a second switching device that are connected in series between a first potential and a second potential lower than the first potential, wherein each of the first and second switching devices includes a transistor region, and a diode region electrically connected in anti-parallel to the transistor region, the transistor region includes a first gate controlled by a first gate signal, and the diode region includes a diode gate controlled by a diode gate signal.

6 Claims, 41 Drawing Sheets

FIG. 41

| ACTUAL OPERATION MODE | | $G_{I1}$ (WITH RESPECT TO Ve) | $G_{I2}$ (WITH RESPECT TO Vc) | $G_D$ (WITH RESPECT TO Ve) |
|---|---|---|---|---|
| t1,t4 | FORWARD/REVERSE CONDUCTION MODE | +V | Vc or -V | Ve or -V |
| t2a,t5a | SWITCH FROM FORWARD/REVERSE CONDUCTION MODE TO NON-CONDUCTION MODE (TURN ON $G_{I1}$) | +V | +V | +V |
| t2b,t5b | SWITCH FROM FORWARD/REVERSE CONDUCTION MODE TO NON-CONDUCTION MODE (TURN OFF $G_{I1}$) | Ve or -V | +V | Ve or -V (TURN ON $G_{I1}$ OF OTHER ARM) |
| t3,t6 | NON-CONDUCTION MODE | Ve or -V | Vc or +V | Ve or -V |

SEMICONDUCTOR DEVICE AND METHOD FOR CONTROLLING THE SAME

BACKGROUND OF THE INVENTION

Field of the Invention

The present disclosure relates to a semiconductor device, and particularly to a semiconductor device that is easily controlled.

Description of the Background Art

Conventionally, a method for controlling a reverse-conducting insulated-gate bipolar transistor (RC-IGBT) including an IGBT and a freewheeling diode on the same semiconductor substrate has been changed according to one of two conduction states, namely, a forward inode in which a current flows through the IGBT or a reverse mode in which a current flows through the freewheeling diode, as disclosed in Japanese Patent No. 6652173.

Changing the control method according to a conduction state of the RC-IGBT as described above requires detection or estimation of an operation state of the RC-IGBT. Thus, its implementation has been very difficult.

SUMMARY

The object of the present disclosure is to provide a semiconductor device that is easily controlled.

The semiconductor device includes a first switching device and a second switching device that are connected in series between a first potential and a second potential lower than the first potential, wherein each of the first and second switching devices includes a transistor region, and a diode region electrically connected in anti-parallel to the transistor region, the transistor region includes a first gate controlled by a first gate signal, and the diode region includes a diode gate controlled by a diode gate signal.

Since the semiconductor device according to the present disclosure includes, in the diode region, diode gates controlled by a gate signal, control for turning ON the diode gates in preparing the reverse recovery of the diode region reduces an amount of injected holes in the diode region, and reduces the reverse recovery loss in the subsequent reverse recovery of the diode region. Thus, the semiconductor device including, in the diode region, the diode gates controlled by the gate signal eliminates the need for detecting or estimating an operation state in changing a method for controlling the semiconductor device according to its conduction state. This facilitates the control.

These and other objects, features, aspects, and advantages of the present invention will become more apparent from the following detailed description of the present invention when taken in conjunction with the accompanying drawings.

BRIEF DESCRIPTION OF THE DRAWINGS

FIG. 41 illustrates a summary of the gate control on the RC-IGBT according to Embodiment 3.

DESCRIPTION OF THE PREFERRED EMBODIMENTS

Introduction

Figure 1:
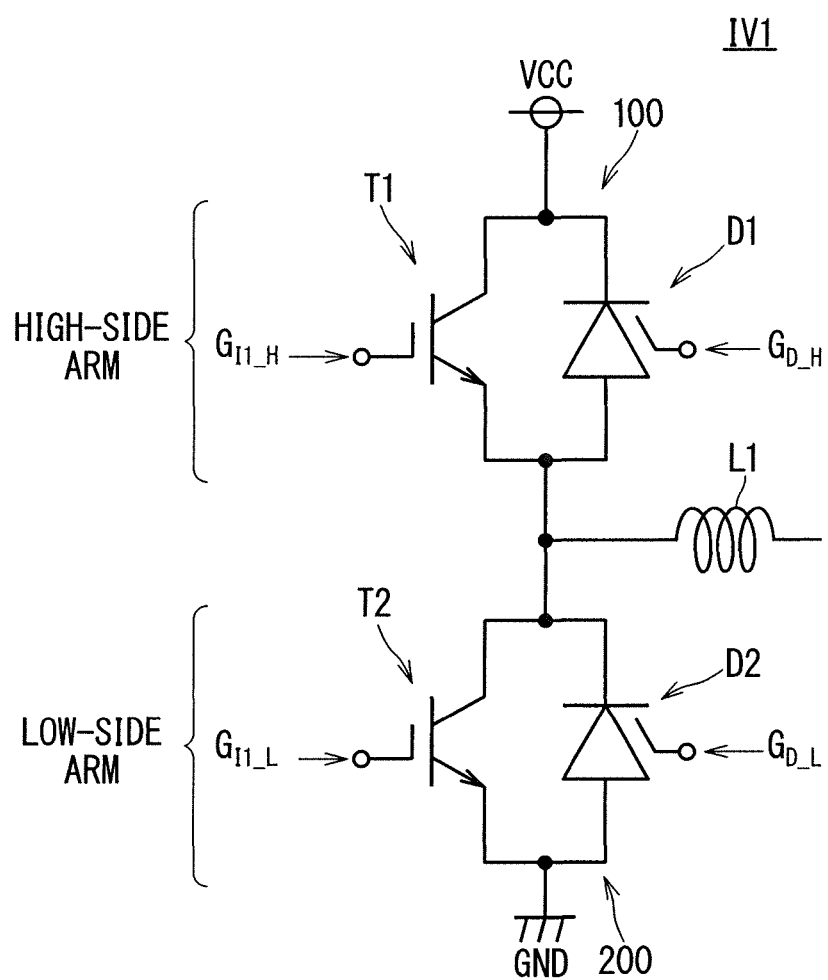
FIG. 1 is a circuit diagram illustrating a structure of an inverter circuit according to Embodiment 1.

In the following description of the present disclosure, n-type and p-type denote semiconductor conductivity types, the first conductivity type is n-type, and the second conductivity type is p-type. Conversely, the first conductivity type may be p-type, and the second conductivity type may be n-type. Furthermore, n⁻ type represents an impurity concentration lower than that of n-type, and n⁺ type represents an impurity concentration higher than that of n-type. Similarly, p⁻ type represents an impurity concentration lower than that of p-type, and p⁺ type represents an impurity concentration higher than that of p-type.

Since the drawings are schematically illustrated, the mutual relationships in size and position between images in the different drawings are not necessarily accurate but may be appropriately changed. In the following description, the same reference numerals are applied to the same constituent elements, and their names and functions are the same. Thus, the detailed description thereof may be omitted.

Although the description below sometimes uses the words representing particular positions and directions including "up", "down", "side", "front", and "back", these are used for convenience to facilitate the understanding of the details of Embodiments, and do not relate to the directions for actual use.

Embodiment 1

[Device Structure]

FIG. 1 is a circuit diagram illustrating a structure of an inverter circuit IV1 of one phase according to Embodiment 1 of the present disclosure.

In the inverter circuit IV1 of FIG. 1, an RC-IGBT 100 (a first switching device) functioning as a high-side arm and an RC-IGBT 200 (a second switching device) functioning as a low-side arm are connected in series between a power supply potential VCC (a first potential) and a reference potential GND (a second potential). A connection node between the RC-IGBT 100 and the RC-IGBT 200 is connected to an inductance load L1.

The RC-IGBT 100 has a structure in which an IGBT region T1 controlled by a gate signal $G_{T1\_H}$ (a first gate signal) is connected in anti-parallel to a diode region D1 controlled by a gate signal $G_{D\_H}$ (a diode gate signal).

Furthermore, the RC-IGBT 200 has a structure in which an IGBT region T2 controlled by a gate signal $G_{T1\_L}$ (a first gate signal) is connected in anti-parallel to a diode region D2 controlled by a gate signal $G_{D\_L}$ (a diode gate signal).

Here, the gate signal $G_{T\_H}$ is given to first trench gates formed in the IGBT region T1, whereas the gate signal $G_{T1\_L}$ is given to first trench gates formed in the IGBT region T2. Furthermore, the gate signal $G_{D\_H}$ is given to diode trenches formed in the diode region D1, whereas the gate signal $G_{D\_L}$ is given to diode trenches formed in the diode region D2.

Thus, application of control signals such as the gate signals $G_{D\_H}$ and $G_{D\_L}$ facilitates the control more than conventional semiconductor devices using two gate signals.

Figure 2:
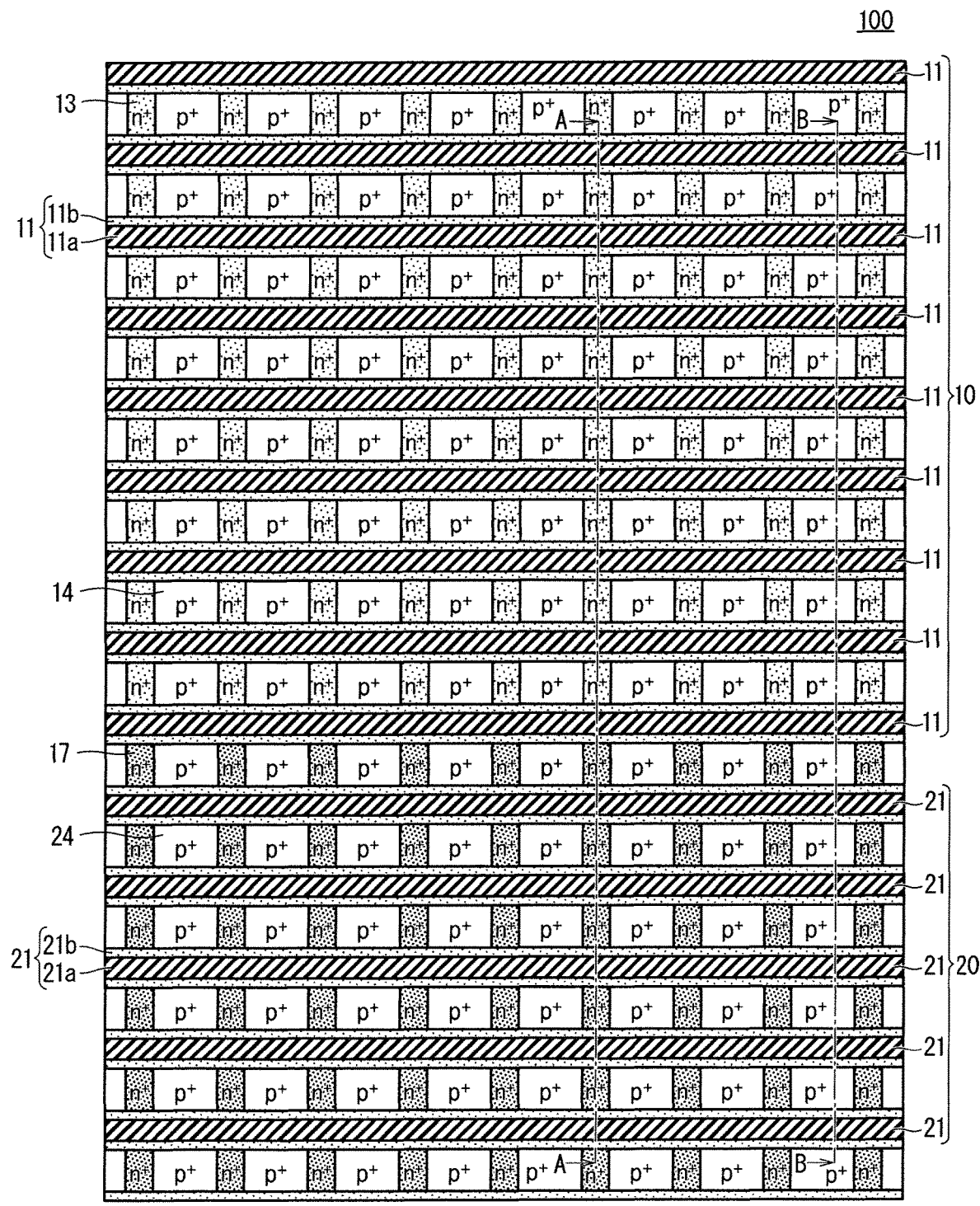
FIG. 2 is a plan view of an RC-IGBT in the inverter circuit according to Embodiment 1 when viewed from the top surface.
Figure 3:
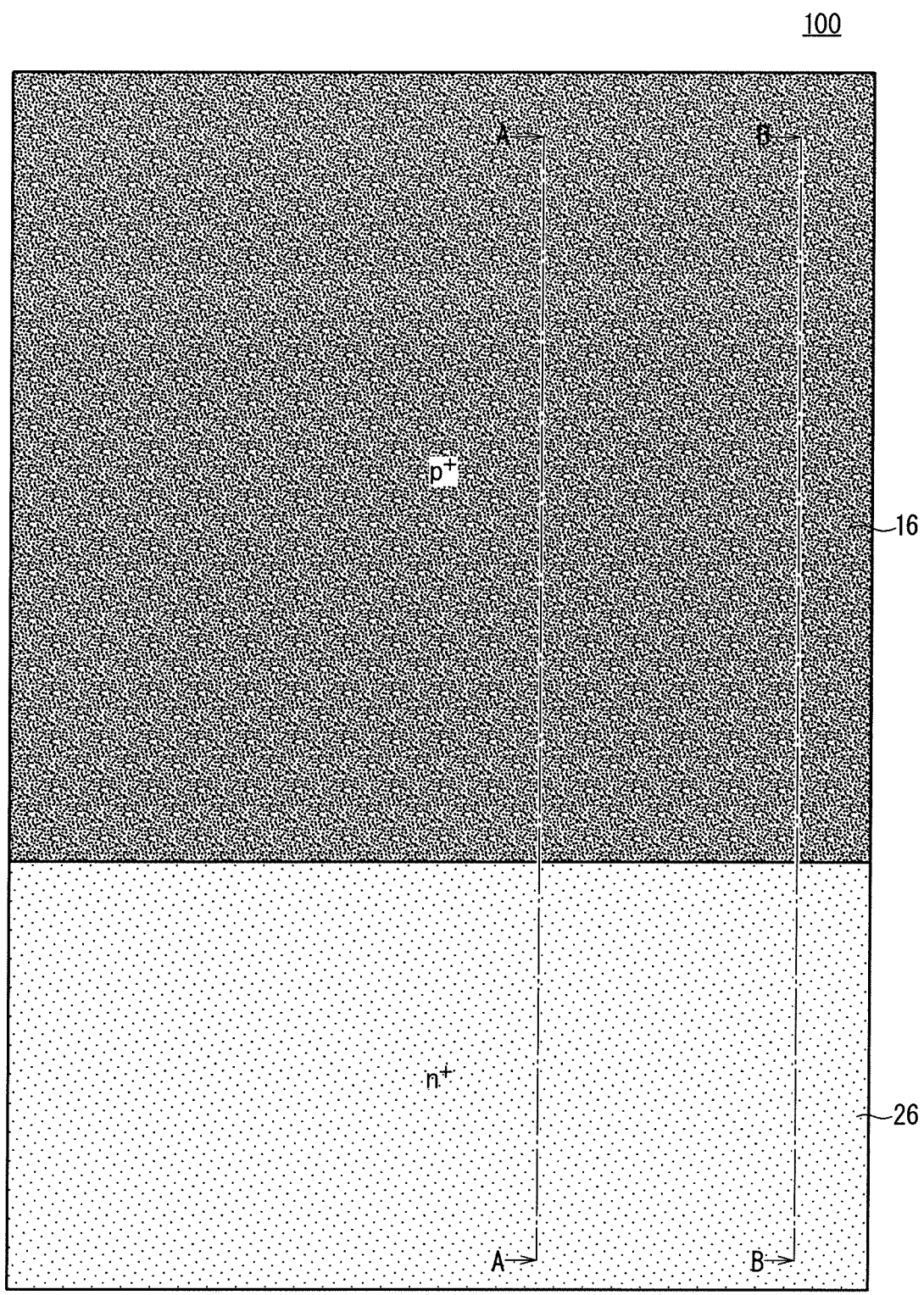
FIG. 3 is a plan view of the RC-IGBT in the inverter circuit according to Embodiment 1 when viewed from the bottom surface.

FIG. 2 is a plan view of the RC-IGBT 100 in the inverter circuit IV1 according to Embodiment 1 when viewed from the top surface. FIG. 3 is a plan view of the RC-IGBT 100 when viewed from the bottom surface. The IGBT region T1 will be referred to as an IGBT region 10 (a transistor region), and the diode region D1 will be referred to as a diode region 20 (a diode region) in the following description for convenience. The illustration of, for example, electrodes and insulating films formed in a semiconductor substrate will be omitted in the plan views for convenience.

As illustrated in FIG. 2, the RC-IGBT 100 consists of IGBT regions 10 and diode regions 20 that are arranged in stripes, and can be categorized as having a stripe geometry. The RC-IGBT 100 may consist of a plurality of diode regions 20 arranged in both vertical and horizontal directions, and IGBT regions 10 surrounding the diode regions 20. This can be categorized as having an island geometry. Although the RC-IGBT 100 with the stripe geometry will be described in the following as an example, the RC-IGBT 100 with the island geometry has the same advantages.

In FIG. 2, the IGBT regions 10 and the diode regions 20 extend from one end to another end of the RC-IGBT 100, and are alternately arranged in stripes in a direction orthogonal to the extension direction of the IGBT regions 10 and the diode regions 20. Furthermore, the IGBT regions 10 and the diode regions 20 in FIG. 2 can be interchanged with each other, whereas all the IGBT regions 10 can be sandwiched between the diode regions 20. Furthermore, the IGBT regions 10 and the diode regions 20 can be positioned one adjacent another.

[Structure of IGBT Region 10]

As illustrated in FIG. 2, the IGBT region 10 includes active trench gates 11 (first gates) arranged in stripes. The active trench gates 11 extend in the longitudinal direction of the IGBT region 10 which coincides with the longitudinal direction of the active trench gates 11.

Each of the active trench gates 11 is formed by embedding a gate trench electrode 11a through a gate trench insulating film 11b in a trench formed in a semiconductor substrate. The gate trench electrodes 11a of the active trench gates 11 are electrically connected to a gate pad that is not illustrated.

N⁺ type source layers 13 are formed across both sides of the active trench gates 11 in a width direction to be in contact with the gate trench insulating films 11b. Each of the n⁺ type source layers 13 is a semiconductor layer containing, for example, arsenic or phosphorus as n-type impurities. A concentration of the n-type impurities ranges from $1.0 \times 10^{17}$/ cm$^3$ to $1.0\times10^{20}$/cm$^3$. The n$^+$ type source layers 13 and p$^+$ type contact layers 14 are alternately formed in the extension direction of the active trench gates 11.

Each of the p$^+$ contact layers 14 is a semiconductor layer containing, for example, boron or aluminum as p-type impurities. A concentration of the p-type impurities ranges from $1.0\times10^{15}$/cm$^3$ to $1.0\times10^{20}$/cm$^3$.

Figure 4:
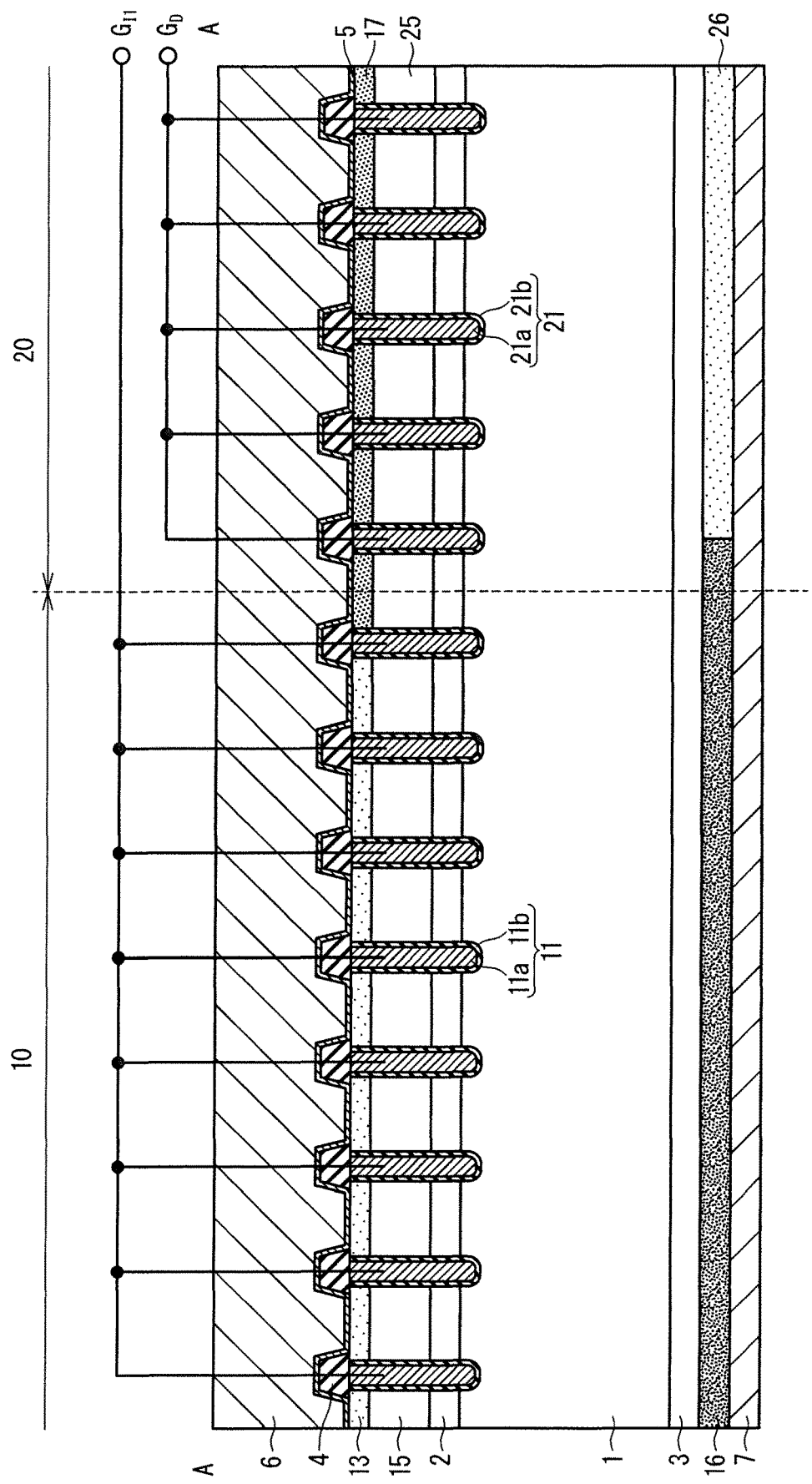
FIG. 4 is a cross-sectional view illustrating a structure of the RC-IGBT in the inverter circuit according to Embodiment 1.

FIG. 4 illustrates a cross-sectional view taken along a broken line A-A of the RC-IGBT 100 in FIG. 2. The RC-IGBT 100 in FIG. 4 includes a semiconductor substrate including an n$^-$ type drift layer 1. The n type drift layer 1 is a semiconductor layer containing, for example, arsenic or phosphorus as n-type impurities. A concentration of the n-type impurities ranges from $1.0\times10^{12}$/cm$^3$ to $1.0\times10^{15}$/cm$^3$. The semiconductor substrate ranges from the n$^+$ type source layers 13 and the p$^+$ type contact layers 14 to a p-type collector layer 16. The top end of the n$^+$ type source layers 13 and the p$^+$ type contact layers 14 on the plane of the paper will be referred to as a first principal surface (a top surface) of the semiconductor substrate, and the bottom end of the p-type collector layer 16 on the plane of the paper will be referred to as a second principal surface (a bottom surface) of the semiconductor substrate. The first principal surface of the semiconductor substrate is a principal surface on the front side of the RC-IGBT 100, and the second principal surface of the semiconductor substrate is a principal surface on the back side of the RC-IGBT 100. The RC-IGBT 100 includes, in the IGBT region 10 that is a cell region, the n$^-$ type drift layer 1 between the first principal surface and the second principal surface facing the first principal surface.

In the IGBT region 10, an n-type carrier storage layer 2 higher in n-type impurity than the n$^-$ type drift layer 1 is disposed on the n type drift layer 1 on the first principal surface side. The n-type carrier storage layer 2 is a semiconductor layer containing, for example, arsenic or phosphorus as n-type impurities. A concentration of the n-type impurities ranges from $1.0\times10^{13}$/cm$^3$ to $1.0\times10^{17}$/cm$^3$. The RC-IGBT 100 can have a structure in which the n type drift layer 1 occupies a region of the n-type carrier storage layer 2, without the n-type carrier storage layer 2. The n-type carrier storage layer 2 can reduce the conduction loss when a current flows through the IGBT region 10. The n-type carrier storage layer 2 and the n$^-$ type drift layer 1 can be collectively referred to as a drift layer.

A p-type base layer 15 is disposed on the n-type carrier storage layer 2 on the first principal surface side. The p-type base layer 15 is a semiconductor layer containing, for example, boron or aluminum as p-type impurities. A concentration of the p-type impurities ranges from $1.0\times10^{12}$/cm$^3$ to $1.0\times10^{19}$/cm$^3$. The p-type base layer 15 is in contact with the gate trench insulating films 11b of the active trench gates H. The n$^+$ type source layers 13 are disposed on the p-type base layer 15 on the first principal surface side to be in contact with the gate trench insulating films 11b of the active trench gates 11, and the p contact layers 14 are disposed on the remaining regions on the p-type base layer 15. The n$^+$ type source layers 13 and the p$^+$ type contact layers 14 make up the first principal surface of the semiconductor substrate. The p$^+$ type contact layers 14 are regions higher in p-type impurity than the p-type base layer 15. When there is need to distinguish between the p$^+$ type contact layers 14 and the p-type base layer 15, the p$^+$ type contact layers 14 and the p-type base layer 15 can be referred to by their separate names. Alternatively, the p$^+$ type contact layers 14 and the p-type base layer 15 can be collectively referred to as a p-type base layer.

Furthermore, the RC-IGBT 100 includes, on the n type drift layer 1 on the second principal surface side, an n-type buffer layer 3 higher in n-type impurity than the n$^-$ type drift layer 1. The n-type buffer layer 3 suppresses punch-through of a depletion layer extending from the p-type base layer 15 toward the second principal surface side when the RC-IGBT 100 is in an OFF state. The n-type buffer layer 3 can be formed by injecting, for example, one of or both of phosphorus (P) and proton (H$^+$). The n-type buffer layer 3 has a concentration of n-type impurities ranging from $1.0\times10^{12}$/cm$^3$ to $1.0\times10^{18}$/cm$^3$.

The RC-IGBT 100 can have a structure in which the n$^-$ drift layer 1 occupies a region of the n-type buffer layer 3 in FIG. 4, without the n-type buffer layer 3. The n-type buffer layer 3 and the n$^-$ drift layer 1 can be collectively referred to as a drift layer.

The RC-IGBT 100 includes the p-type collector layer 16 on the n-type buffer layer 3 on the second principal surface side. In other words, the p-type collector layer 16 is disposed between the n$^-$ drift layer 1 and the second principal surface. The p-type collector layer 16 is a semiconductor layer containing, for example, boron or aluminum as p-type impurities. A concentration of the p-type impurities ranges from $1.0\times10^{16}$/cm$^3$ to $1.0\times10^{20}$/cm$^3$. The p-type collector layer 16 makes up the second principal surface of the semiconductor substrate. A part of the p-type collector layer 16 can extend off the IGBT region 10 and enter the diode region 20.

The RC-IGBT 100 includes trenches penetrating the p-type base layer 15 from the first principal surface of the semiconductor substrate and reaching the n type drift layer 1. Each of the trenches includes the active trench gate 11 formed by embedding the gate trench electrode 11a through the gate trench insulating film 11b.

The gate trench electrodes 11a face the n type drift layer 1 through the gate trench insulating films 11b. The gate trench insulating films 11b of the active trench gates 11 are in contact with the p-type base layer 15 and the type source layers 13. When a gate drive voltage is applied to the gate trench electrodes 11a, a channel is formed in the p-type base layer 15 that is in contact with the gate trench insulating films 11b of the active trench gates 11.

An interlayer insulating film 4 is disposed on the gate trench electrodes 11a of the active trench gates 11. The interlayer insulating film 4 on the gate trench electrodes 11a of the active trench gates 11 insulates the gate trench electrodes 11a from an emitter electrode 6 so that the gate trench electrodes 11a receive the gate signal G$_{r1}$.

A barrier metal 5 is formed on a region without the interlayer insulating film 4 on the first principal surface of the semiconductor substrate, and on the interlayer insulating film 4. The barrier metal 5 can be, for example, a conductor containing titanium (Ti), e.g., a conductor made of TiSi obtained by alloying silicon (Si) with titanium nitride or titanium. The barrier metal 5 is in Ohmic contact with and electrically connected to the n$^+$ type source layer 13 and an n$^+$ type contact layer 17. The emitter electrode 6 is disposed on the barrier metal 5. The emitter electrode 6 can be made of, for example, an aluminum alloy such as an aluminum silicon alloy (an Al—Si based alloy). The emitter electrode 6 can also be an electrode obtained by forming, on an electrode made of an aluminum alloy, a metal film with a plurality of layers on each of which a plated film is formed by electroless plating or electroplating. The plated films formed by electroless plating or electroplating can be, for example, nickel (Ni) plated films. When the RC-IGBT 100 includes a fine region between the emitter electrode 6 and the adjacent interlayer insulating film 4 and the fine region is not sufficiently embedded by the emitter electrode 6, tungsten with embedded properties better than those of the emitter electrode 6 can be disposed on the fine region and then the emitter electrode 6 can be disposed on the tungsten. The emitter electrode 6 can be disposed on the n$^+$ type source layer 13 and the n$^+$ type contact layer 17 without the barrier metal 5. Furthermore, the barrier metal 5 can be disposed only on n-type semiconductor layers such as the n$^+$ type source layers 13. The barrier metal 5 and the emitter electrode 6 can be collectively referred to as an emitter electrode.

A collector electrode 7 is disposed on the p-type collector layer 16 on the second principal surface side. The collector electrode 7 can be made of an aluminum alloy or an aluminum alloy and plated films, similarly to the emitter electrode 6. Furthermore, the collector electrode 7 may have a structure different from that of the emitter electrode 6. The collector electrode 7 is in Ohmic contact with and electrically connected to the p-type collector layer 16.

Figure 5:
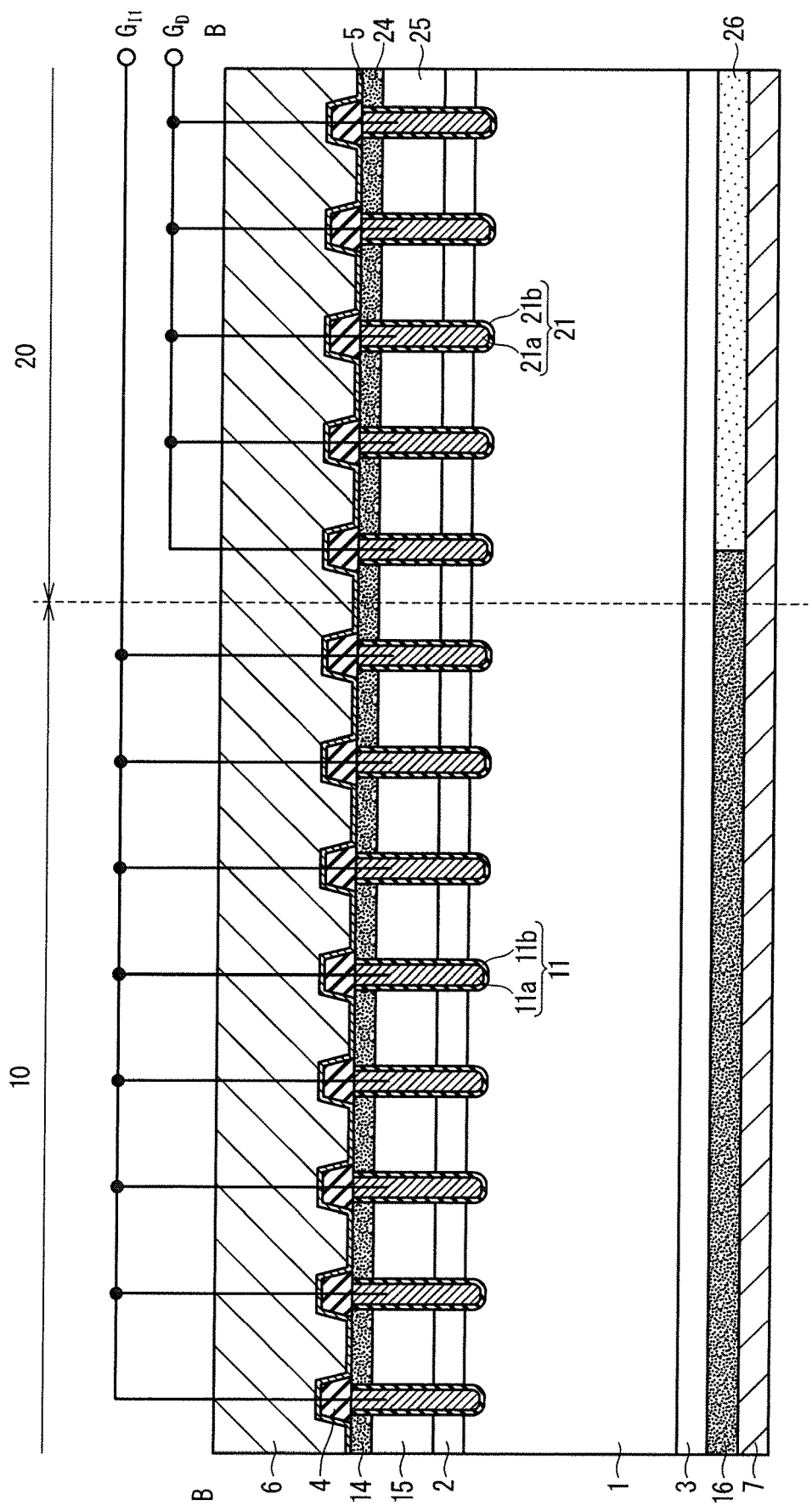
FIG. 5 is a cross-sectional view illustrating a structure of the RC-IGBT in the inverter circuit according to Embodiment 1.

A cross-sectional view of the RC-IGBT 100 in FIG. 5 which is taken along a broken line B-B differs from the cross-sectional view taken along the broken line A-A by excluding the n' type source layers 13 that are in contact with the active trench gates 11 and formed on the first principal surface of the semiconductor substrate. In other words, the n$^+$ type source layers 13 are selectively disposed on a p-type base layer on the first principal surface side. The p-type base layer herein means a p-type base layer that is a generic name for the p-type base layer 15 and the p$^+$ type contact layers 14.

[Structure of Diode Region 20]

As illustrated in FIG. 2, diode trench gates 21 (diode gates) extend from one end to another end of the diode region 20 that is a cell region, along the first principal surface of the RC-IGBT 100. Each of the diode trench gates 21 is formed by embedding a diode trench electrode 21a through a diode trench insulating film 21b in a trench of the diode region 20 formed in the semiconductor substrate.

As illustrated in FIG. 5, the diode trench electrodes 21a faces the n$^-$ type drift layer 1 through the diode trench insulating films 21b. The n$^+$ type contact layers 17 and p$^+$ type contact layers 24 are disposed between the two adjacent diode trench gates 21. Each of the n$^+$ type contact layers 17 is a semiconductor layer containing, for example, arsenic or phosphorus as n-type impurities. A concentration of the n-type impurities ranges from $1.0\times10^{17}/cm^3$ to $1.0\times10^{20}/cm^3$. Each of the p$^+$ type contact layers 24 is a semiconductor layer containing, for example, boron or aluminum as p-type impurities. A concentration of the p-type impurities ranges from $1.0\times10^{15}/cm^3$ to $1.0\times020/cm^3$. The n$^+$ type contact layers 17 and the p$^+$ type contact layers 24 are alternately formed in the longitudinal direction of the diode trench gates 21.

As illustrated in the cross-sectional view of FIG. 4 which is taken along the broken line A-A of the RC-IGBT 100, the diode region 20 includes the semiconductor substrate including then type drift layer 1 as well as in the IGBT region 10. Then type drift layer 1 in the diode region 20 and the IGBT region 10 is continuously and integrally formed, and included in the same semiconductor substrate. The top end of the n$^+$ type contact layers 17 on the plane of the paper will be referred to as the first principal surface of the semiconductor substrate, and the bottom end of an n$^+$ type cathode layer 26 on the plane of the paper will be referred to as the second principal surface of the semiconductor substrate. The first principal surface of the diode region 20 is flush with the first principal surface of the IGBT region 10, and the second principal surface of the diode region 20 is flush with the second principal surface of the IGBT region 10.

The diode region 20 includes the n-type carrier storage layer 2 disposed on the n$^-$ type drift layer 1 on the first principal surface side, and the n-type buffer layer 3 on the n$^-$ type drift layer 1 on the second principal surface side, similarly to the IGBT region 10. The n-type carrier storage layer 2 and the n-type buffer layer 3 included in the diode region 20 have the same structures as those in the IGBT region 10. The n-type carrier storage layer 2 need not always be included in the IGBT region 10 and the diode region 20. Even when the IGBT region 10 includes the n-type carrier storage layer 2, the diode region 20 can exclude the n-type carrier storage layer 2. Furthermore, the n-type drift layer 1, the n-type carrier storage layer 2, and the n-type buffer layer 3 can be collectively referred to as a drift layer similarly to in the IGBT region 10. The n$^+$ type contact layers 17 are disposed on the first principal surface closer to the n-type carrier storage layer 2. The n$^+$ type contact layers 17 are disposed between then drift layer 1 and the first principal surface.

The n$^+$ type contact layers 17 are disposed on a p-type anode layer 25 on the first principal surface side. A concentration of n-type impurities of the n$^+$ type contact layers 17 can be identical to or different from that of the n$^+$ type source layers 13 in the IGBT region 10. The n$^+$ type contact layers 17 make up the first principal surface of the semiconductor substrate. The n$^+$ type contact layers 17 are regions higher in concentration than the p-type anode layer 25.

The diode region 20 includes the n$^+$ type cathode layer 26 on the n-type buffer layer 3 on the second principal surface side. The n$^+$ type cathode layer 26 is disposed between then drift layer 1 and the second principal surface. The n$^+$ type cathode layer 26 is a semiconductor layer containing, for example, arsenic or phosphorus as n-type impurities. A concentration of the n-type impurities ranges from $1.0\times10^{16}/cm^3$ to $1.0\times10^{21}/cm^3$. The n$^+$ type cathode layer 26 is formed in a part or all over in the diode region 20. The n$^+$ type cathode layer 26 makes up the second principal surface of the semiconductor substrate. Although not illustrated, selectively doping a region of the n$^+$ type cathode layer 26 further with p-type impurities can form a p-type cathode layer including a part of the region of the n$^+$ type cathode layer 26 as a p-type semiconductor.

The diode region 20 of the RC-IGBT 100 includes trenches penetrating the p-type anode layer 25 from the first principal surface of the semiconductor substrate and reaching the n$^-$ type drift layer 1. The diode trench gate 21 is formed by embedding the diode trench electrode 21a through the diode trench insulating film 21b in the trench of the diode region 20. The diode trench electrodes 21a face the if type drift layer 1 through the diode trench insulating films 21b.

The barrier metal 5 is formed on the diode trench electrodes 21a and a p$^+$ type contact layer 24. The barrier metal 5 is in Ohmic contact with and electrically connected to the p$^+$ type contact layer 24. The barrier metal 5 can have the same structure as that of the barrier metal 5 in the IGBT region 10. The emitter electrode 6 is disposed on the barrier metal 5. The emitter electrode 6 in the diode region 20 and the IGBT region 10 is continuously formed. The emitter electrode 6 in the diode region 20 can be in Ohmic contact with the p$^+$ type contact layer 24 without the barrier metal 5 as in the IGBT region 10. The interlayer insulating film 4 is formed on the diode trench electrodes 21a of the diode trench gates 21, and insulates the diode trench electrodes 21a from the emitter electrode 6 so that the diode trench electrodes 21a receive the gate signal $G_D$.

The collector electrode 7 is disposed on the $n^+$ type cathode layer 26 on the second principal surface side. The collector electrode 7 in the diode region 20 and the IGBT region is continuously formed, similarly to the emitter electrode 6. The collector electrode 7 is in Ohmic contact with and electrically connected to the $n^+$ type cathode layer 26.

As illustrated in FIG. 5, the cross-sectional view of the RC-IGBT 100 which is taken along the broken line B-B differs from the cross-sectional view taken along the broken line A-A in FIG. 4 by including the $p^+$ type contact layer 24 between the p-type anode layer 25 and the barrier metal 5. The barrier metal 5 is in Ohmic contact with and electrically connected to the $p^+$ type contact layer 24. The barrier metal 5 can have the same structure as that of the barrier metal 5 in the IGBT region 10. The emitter electrode 6 is disposed on the barrier metal 5. The emitter electrode 6 in the diode region 20 and the IGBT region 10 is continuously formed. The emitter electrode 6 in the diode region 20 can be in Ohmic contact with the $p^+$ type contact layer 24 without the barrier metal 5 as in the IGBT region 10.

FIG. 3, which is a plan view of the RC-IGBT 100 when viewed from the bottom surface, that is, from the collector electrode 7, omits the collector electrode 7 for convenience, and illustrates an exposed state of the p-type collector layer 16 and the $n^+$ type cathode layer 26. FIG. 4 and FIG. 5 also illustrate the cross-sectional view taken along the broken line A-A and the cross-sectional view taken along the broken line B-B, respectively, in FIG. 3.

[Modification]

Figure 6:
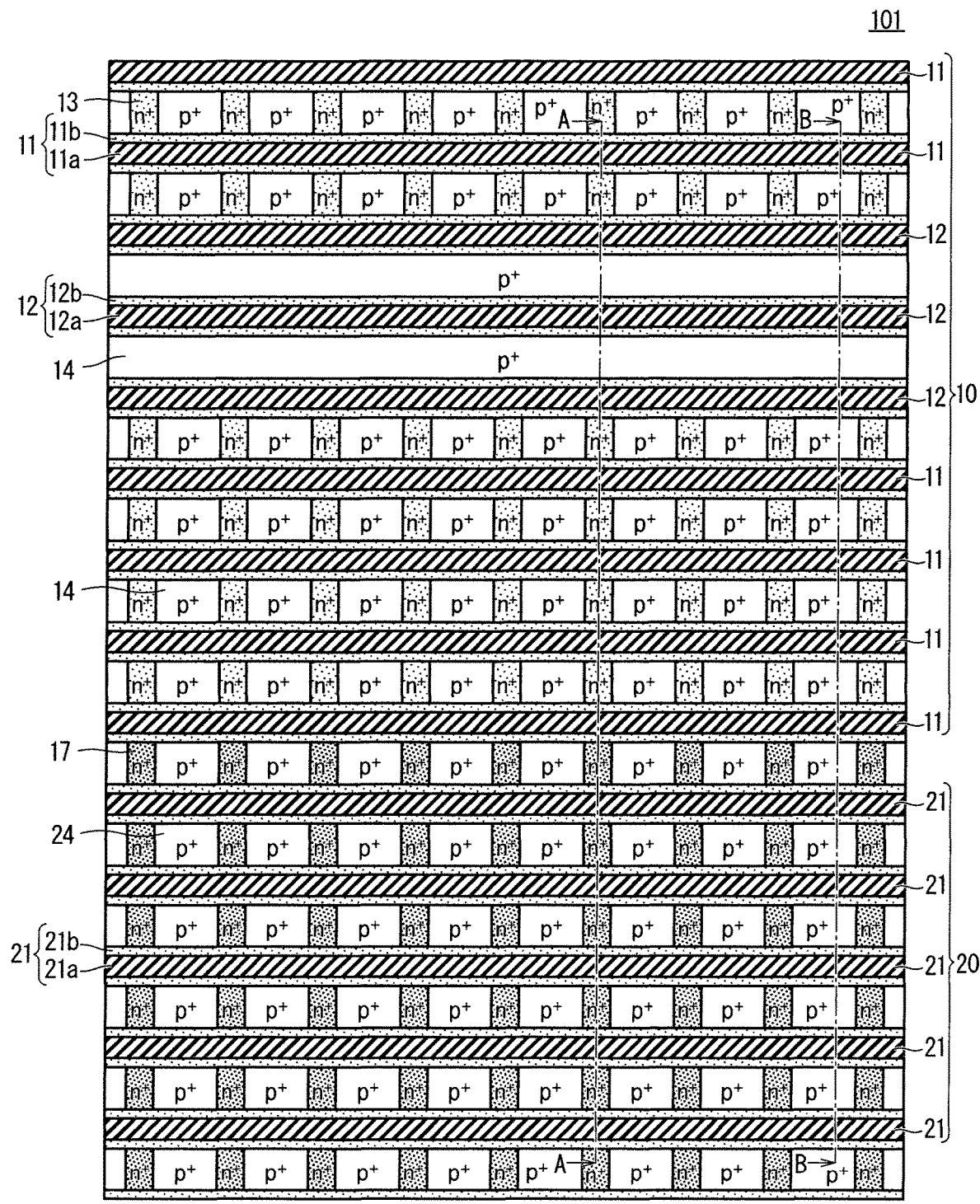
FIG. 6 is a plan view of an RC-IGBT according to a modification of Embodiment 1 when viewed from the top surface.
Figure 7:
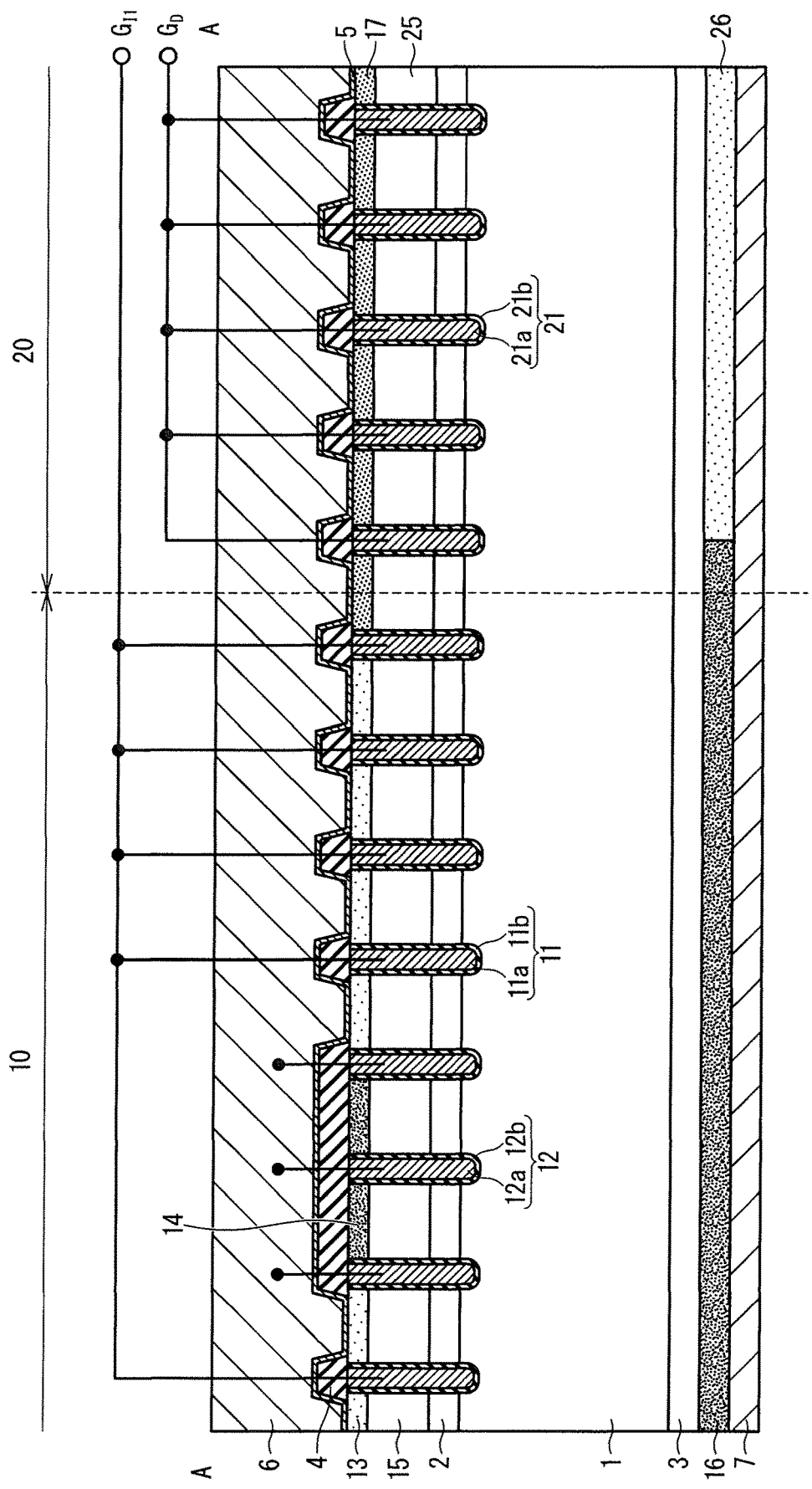
FIG. 7 is a cross-sectional view of the RC-IGBT in an inverter circuit according to the modification of Embodiment 1.
Figure 8:
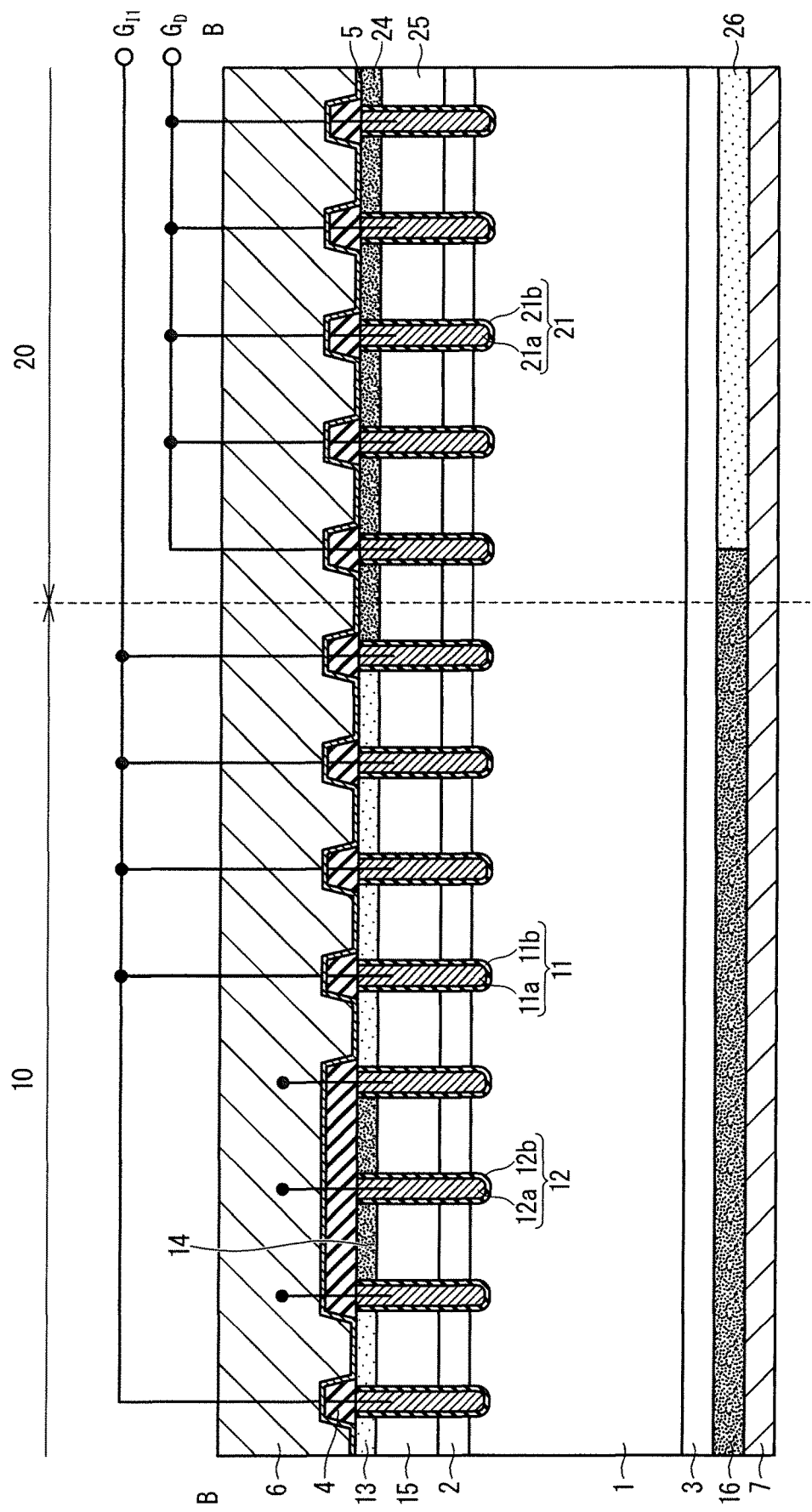
FIG. 8 is a cross-sectional view of the RC-IGBT in the inverter circuit according to the modification of Embodiment 1.

Next, an RC-IGBT 101 according to a modification of Embodiment 1 will be described with reference to FIGS. 6 to 8. FIG. 6 is a plan view of the RC-IGBT 101 when viewed from the top surface. FIG. 7 is a cross-sectional view taken along a broken line A-A in FIG. 6. FIG. 8 is a cross-sectional view taken along a broken line B-B in FIG. 6.

[Structure of IGBT Region 10]

As illustrated in FIG. 6, the IGBT region 10 of the RC-IGBT 101 includes the active trench gates 11 and dummy trench gates 12 that are arranged in stripes. The active trench gates 11 and the dummy trench gates 12 extend in the longitudinal direction of the IGBT region 10 which coincides with the longitudinal direction of the active trench gates 11 and the dummy trench gates 12.

As illustrated in FIG. 7, each of the active trench gates 11 is formed by embedding the gate trench electrode 11a through the gate trench insulating film 11b in the trench formed in the semiconductor substrate. Each of the dummy trench gates 12 is formed by embedding a dummy trench electrode 12a through a dummy trench insulating film 12b in a trench formed in the semiconductor substrate. The gate trench electrodes 11a of the active trench gates 11 are electrically connected to a gate pad that is not illustrated. The dummy trench electrodes 12a of the dummy trench gates 12 are electrically connected to the emitter electrode 6 formed on a first principal surface of the RC-IGBT 101.

The $n^+$ type source layers 13 are formed across both sides of the active trench gates 11 in the width direction to be in contact with the gate trench insulating films 11b. Each of the $n^+$ type source layers 13 is a semiconductor layer containing, for example, arsenic or phosphorus as n-type impurities. A concentration of the n-type impurities ranges from $1.0 \times 10^{17}/\text{cm}^3$ to $1.0 \times 10^{20}/\text{cm}^3$. The $n^+$ type source layers 13 and the $p^+$ type contact layers 14 are alternately formed in the extension direction of the active trench gates 11. The $p^+$ type contact layer 14 is also disposed between the two adjacent dummy trench gates 12. Each of the $p^+$ type contact layers 14 is a semiconductor layer containing, for example, boron or aluminum as p-type impurities. A concentration of the p-type impurities ranges from $1.0 \times 10^{15}/\text{cm}^3$ to $1.0 \times 10^{20}/\text{cm}^3$.

The number of the dummy trench gates 12 included in each of the IGBT regions 10 can be one or more, or zero. In other words, all the trenches included in each of the IGBT regions 10 can be the active trench gates 11. In such a case, the RC-IGBT 100 in FIG. 2 is formed.

The gate trench electrodes 11a face the $n^-$ type drift layer 1 through the gate trench insulating films 11b. The dummy trench electrodes 12a face the $n^-$ type drift layer 1 through the dummy trench insulating films 12b. In FIG. 7 and FIG. 8 illustrating the cross-sectional views taken along the broken line A-A and the broken line B-B, respectively, the interlayer insulating film 4 insulates the $n^+$ type source layers 13 and the $p^+$ type contact layers 14 in a region with the dummy trench gates 12 from the emitter electrode 6. The structure of the diode region 20 is identical to that of the RC-IGBT 100.

The dummy trench gates 12 can enhance the carrier-storage effect, and produce an advantage of reducing the conduction loss through reduction in the resistance.

[Operations]

Figure 9:
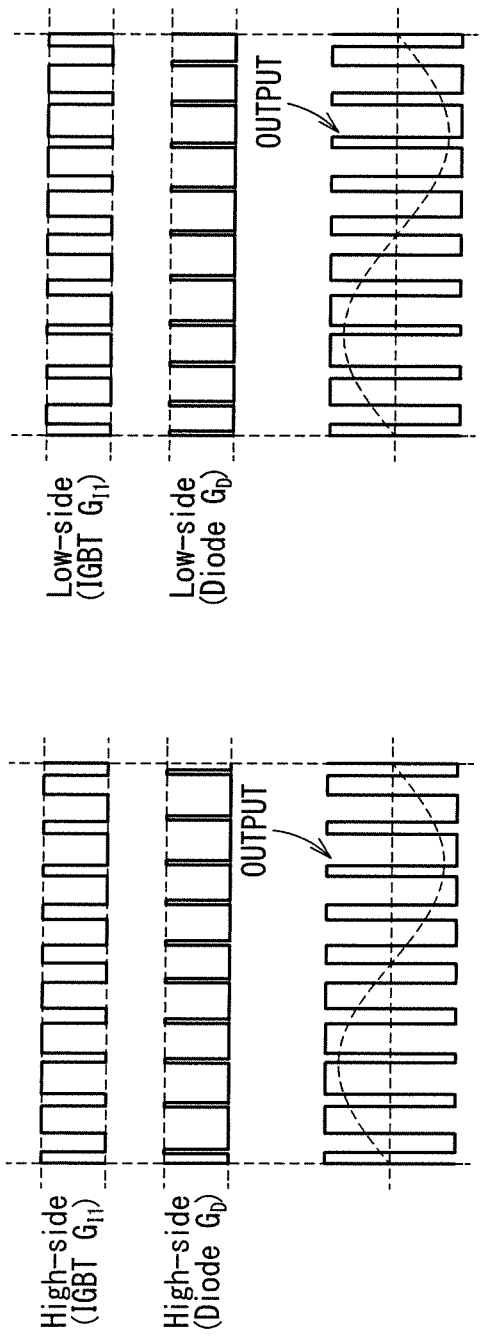
FIG. 9 illustrates timing charts to be used for controlling the inverter circuit according to Embodiment 1.

Next, the gate control in the RC-IGBT 100 will be described with reference to FIGS. 9 to 17. FIG. 9 illustrates timing charts of the gate control in the RC-IGBT 100 functioning as the high-side arm in the inverter circuit IV1 in FIG. 1 in a left diagram, and timing charts of the gate control in the RC-IGBT 200 functioning as the low-side arm in the same circuit in a right diagram.

In the left diagram in FIG. 9, an upper tier illustrates a timing chart of the gate signal $G_{I1}$ given to the active trench gates 11 in the IGBT regions, a middle tier illustrates a timing chart of the gate signal $G_D$ given to the diode trench gates 21 in the diode regions, and a lower tier illustrates a timing chart of the output of the inverter circuit IV1.

In the right diagram in FIG. 9, an upper tier illustrates a timing chart of the gate signal $G_{I1}$ given to the active trench gates 11 in the IGBT regions, a middle tier illustrates a timing chart of the gate signal $G_D$ given to the diode trench gates 21 in the diode regions, and a lower tier illustrates a timing chart of the output of the inverter circuit IV1.

As illustrated in FIG. 9, the RC-IGBT 100 and the RC-IGBT 200 are pulse-width modulation (PWM) controlled. The active trench gates 11 in the IGBT regions receive pulse signals inverted between the high-side arm and the low-side arm according to PMW signals. The diode trench gates 21 in the diode regions receive a pulse signal generated with respect to the gate signal Gil given to the active trench gates 11.

Since the RC-IGBT 100 and the RC-IGBT 200 have the same structure, the following will describe the RC-IGBT 100 as an example. Each of FIGS. 10 to 17 illustrates a timing chart of the RC-IGBT 100 in a left diagram, and a cross-sectional view of the RC-IGBT 100 corresponding to that in FIG. 4 in a right diagram. FIGS. 10 to 17 schematically illustrate an amount of injected holes using the size of an arrow.

Figure 10:
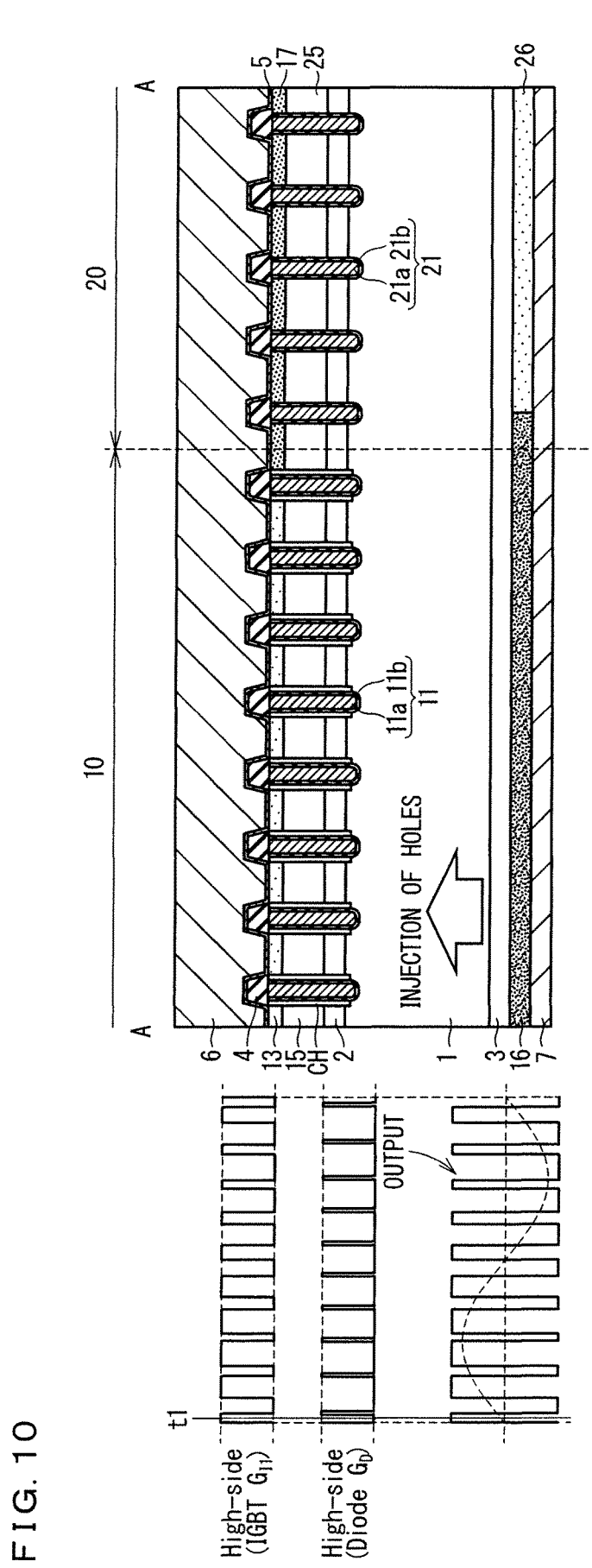
FIG. 10 illustrates the control in the inverter circuit according to Embodiment 1.

FIG. 10 illustrates a carrier state in the RC-IGBT 100 in the right diagram, at a time t1 in the timing chart of the left diagram. At the time t1, the IGBT region 10 is brought into forward conduction, and only the active trench gates 11 closer to the emitter electrode 6 in the IGBT region 10 are ON. When the collector electrode 7 injects holes, the IGBT region 10 is brought into forward conduction through channel layers CH formed on the side surfaces of the active trench gates 11.

Figure 11:
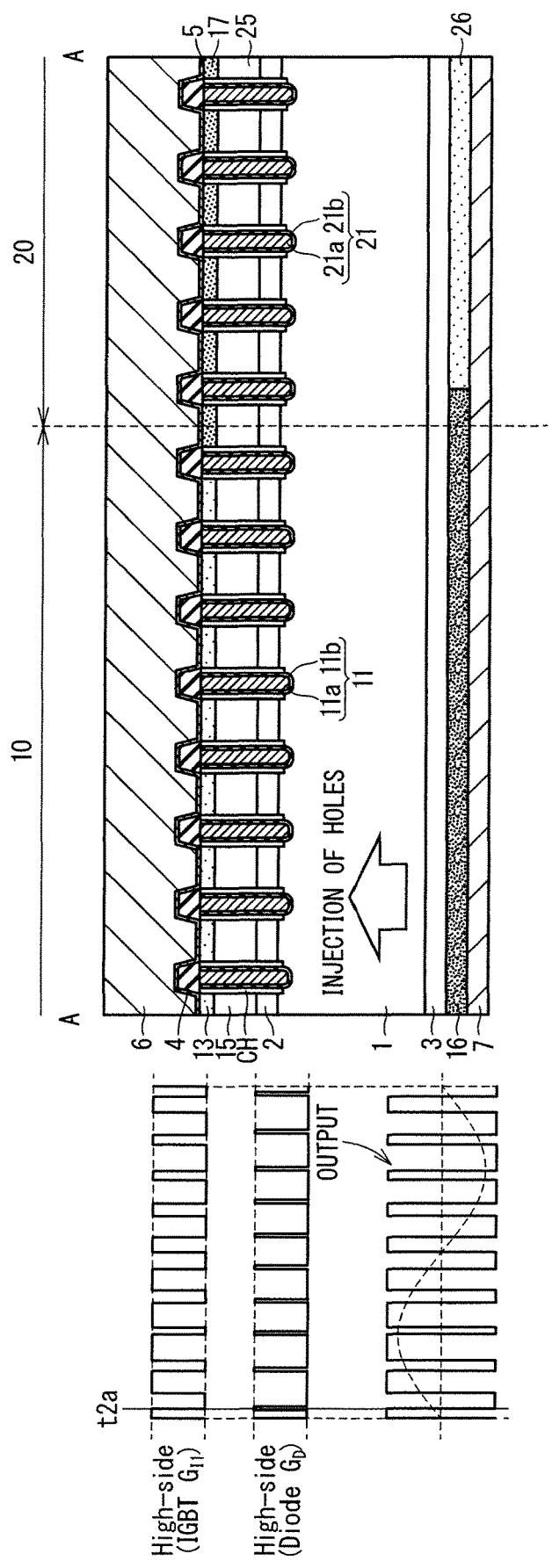
FIG. 11 illustrates the control in the inverter circuit according to Embodiment 1.

FIG. 11 illustrates a carrier state in the RC-IGBT 100 in the right diagram, at a time t2a in the timing chart of the left diagram. At the time t2a, turning off the IGBT region is prepared. The diode trench gates 21 in the diode region 20 are ON, so that channel layers CH are formed on the side surfaces of the diode trench gates 21. However, since holes are injected from the bottom surface not in the diode region 20 but in the IGBT region 10, the diode region 20 is not subject to a big change.

Figure 12:
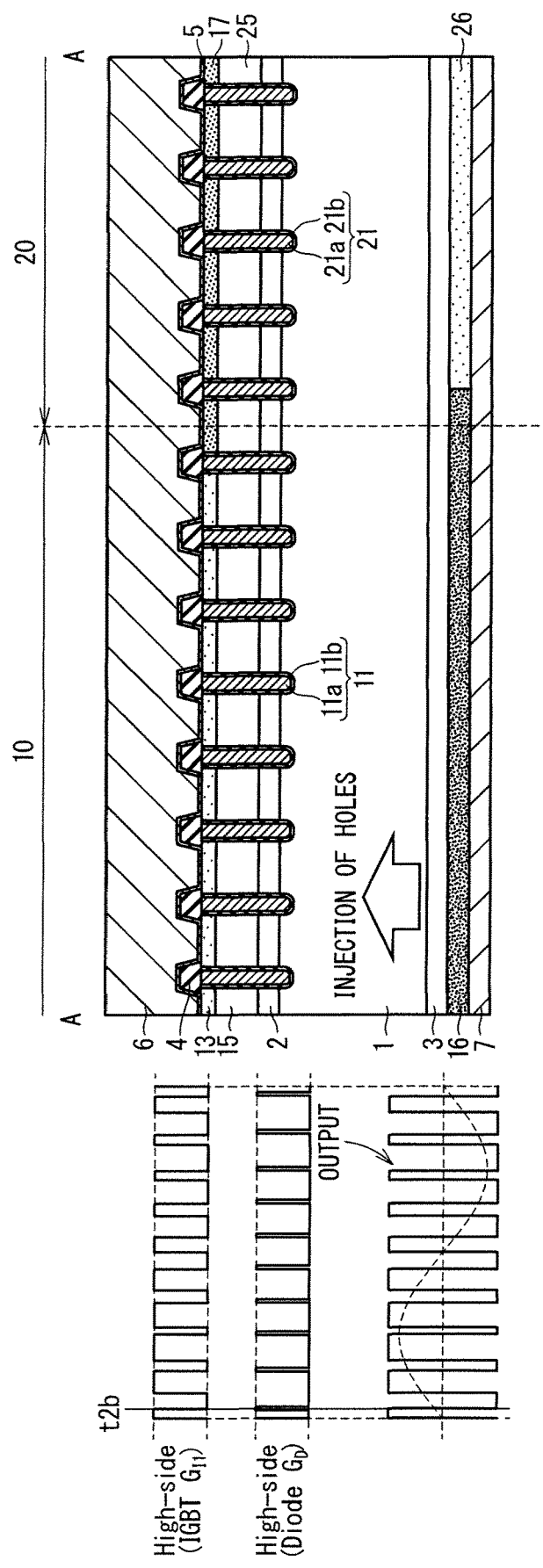
FIG. 12 illustrates the control in the inverter circuit according to Embodiment 1.

FIG. 12 illustrates a carrier state in the RC-IGBT 100 in the right diagram, at a time t2b in the timing chart of the left diagram. At the time t2b, the IGBT region 10 is turned off, and the active trench gates 11 and the diode trench gates 21 are also OFF. However, since the collector electrode 7 continues to inject holes until the diode region 20 that is an opposite arm of the IGBT region 10 conducts, the IGBT region 10 is continuously brought into forward conduction.

Figure 13:
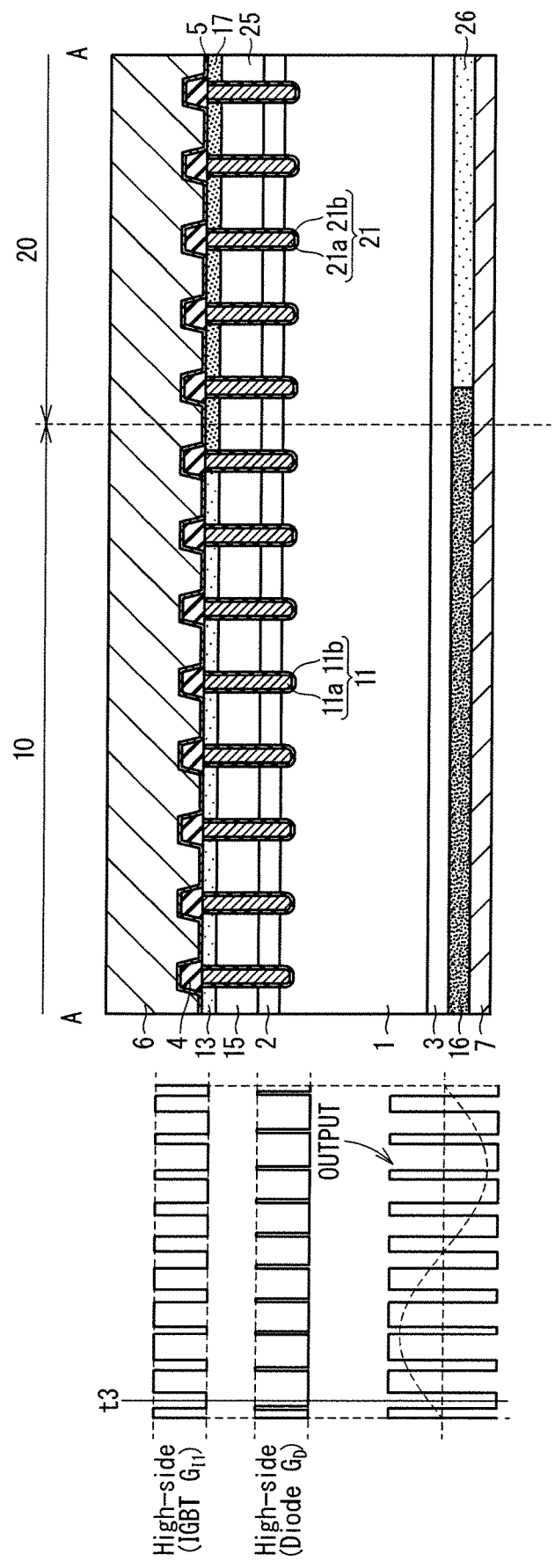
FIG. 13 illustrates the control in the inverter circuit according to Embodiment 1.

FIG. 13 illustrates a carrier state in the RC-IGBT 100 in the right diagram, at a time t3 in the timing chart of the left diagram. At the time t3, the IGBT region 10 does not conduct. Since all the gates are OFF, injection of holes ceases, and the IGBT region 10 does not conduct. These describe the IGBT mode, and are the same operations as those of conventional RC-IGBTs.

Figure 14:
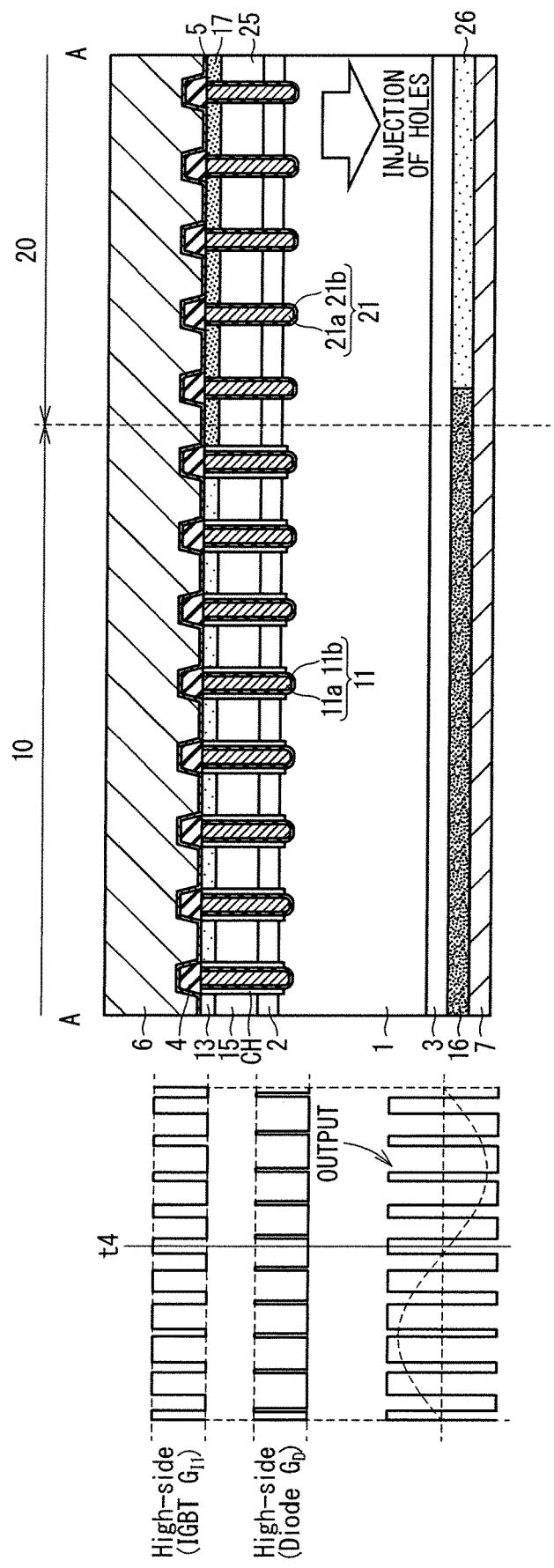
FIG. 14 illustrates the control in the inverter circuit according to Embodiment 1.

FIG. 14 illustrates a carrier state in the RC-IGBT 100 in the right diagram, at a time t4 in the timing chart of the left diagram. At the time t4, the diode region 20 is brought into reverse conduction. The active trench gates 11 in the IGBT region 10 are ON but are distant from the diode region 20. Thus, injection of holes from the emitter electrode 6 brings the diode region 20 into reverse conduction.

Figure 15:
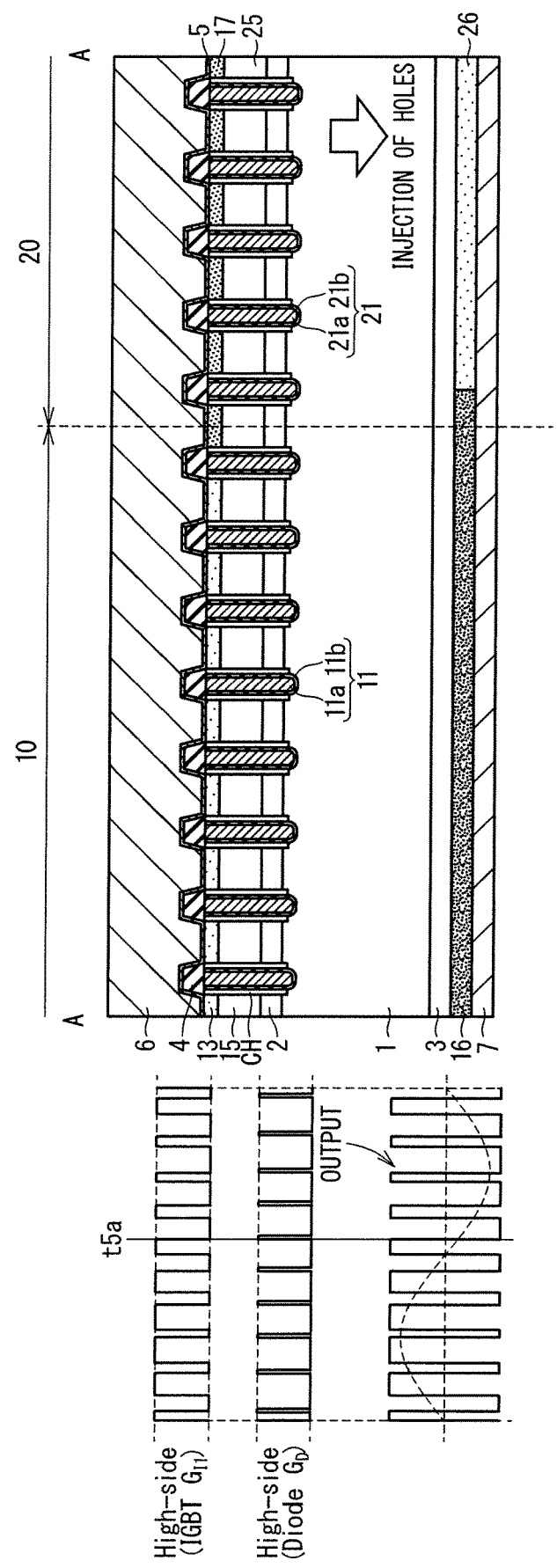
FIG. 15 illustrates the control in the inverter circuit according to Embodiment 1.

FIG. 15 illustrates a carrier state in the RC-IGBT 100 in the right diagram, at a time t5a in the timing chart of the left diagram. At the time t5a, the reverse recovery of the diode region 20 is prepared. Since the diode trench gates 21 are ON, the amount of injected holes in the diode region 20 decreases.

Figure 16:
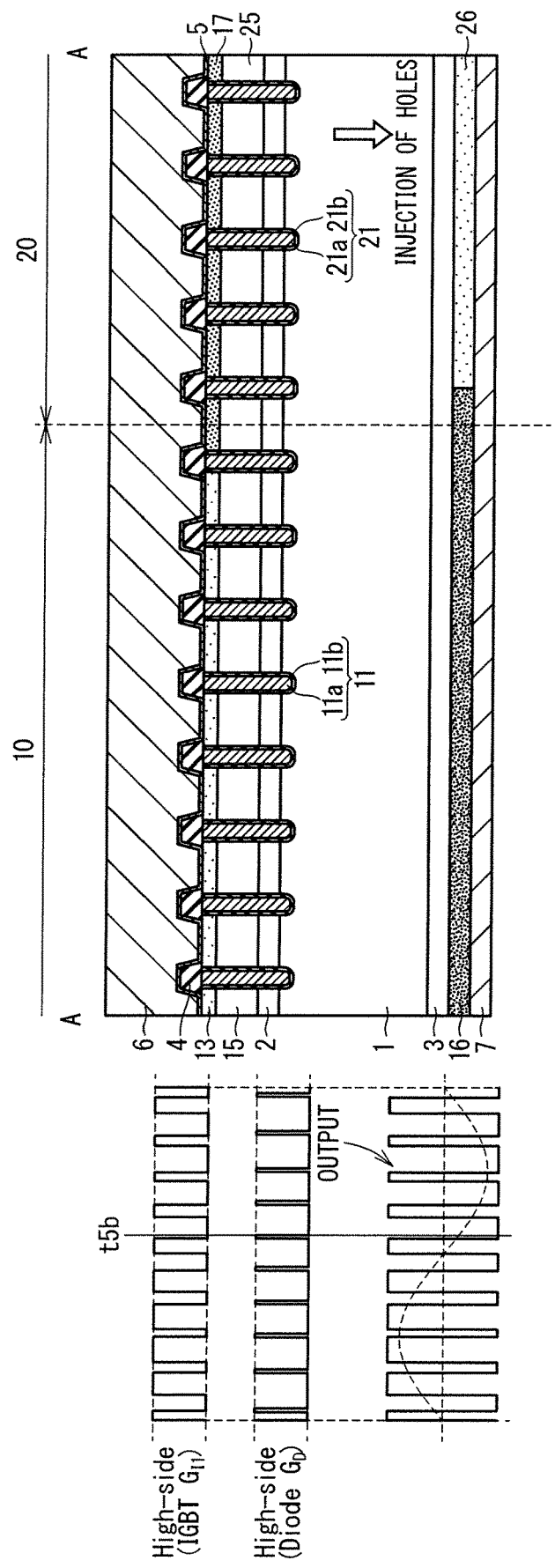
FIG. 16 illustrates the control in the inverter circuit according to Embodiment 1.

FIG. 16 illustrates a carrier state in the RC-IGBT 100 in the right diagram, at a time t5b in the timing chart of the left diagram. The time t5b is a reverse recovery time of the diode region 20. Turning ON the IGBT region 10 that is an opposite arm of the diode region 20 reverse recovers the diode region 20. Here, the amount of injected holes is reduced, and internal carriers are less. Thus, the reverse recovery loss decreases.

Figure 17:
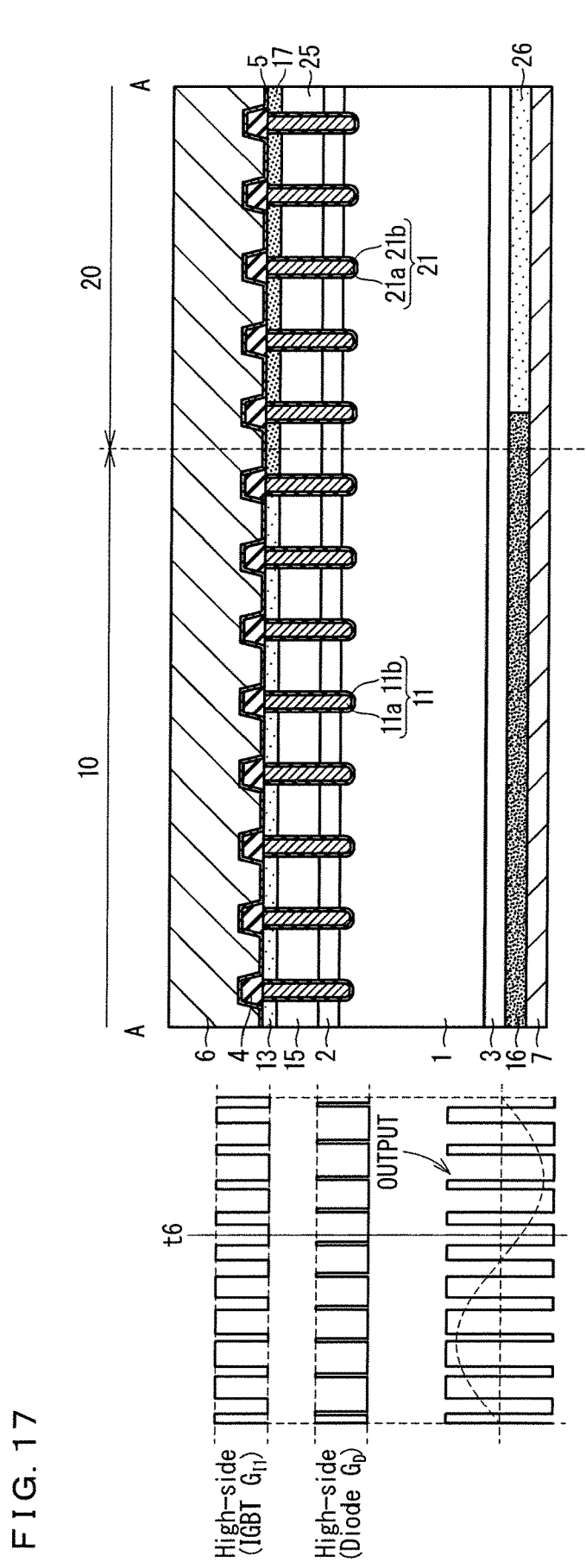
FIG. 17 illustrates the control in the inverter circuit according to Embodiment 1.

FIG. 17 illustrates a carrier state in the RC-IGBT 100 in the right diagram, at a time t6 in the timing chart of the left diagram. At the time t6, the diode region 20 does not conduct. Since a voltage is applied in a current blocking direction for a diode, the diode region 20 does not conduct.

In the aforementioned diode mode, the reverse recovery loss significantly decreases more than those of conventional RC-IGBTs.

Embodiment 2

[Device Structure]

Figure 18:
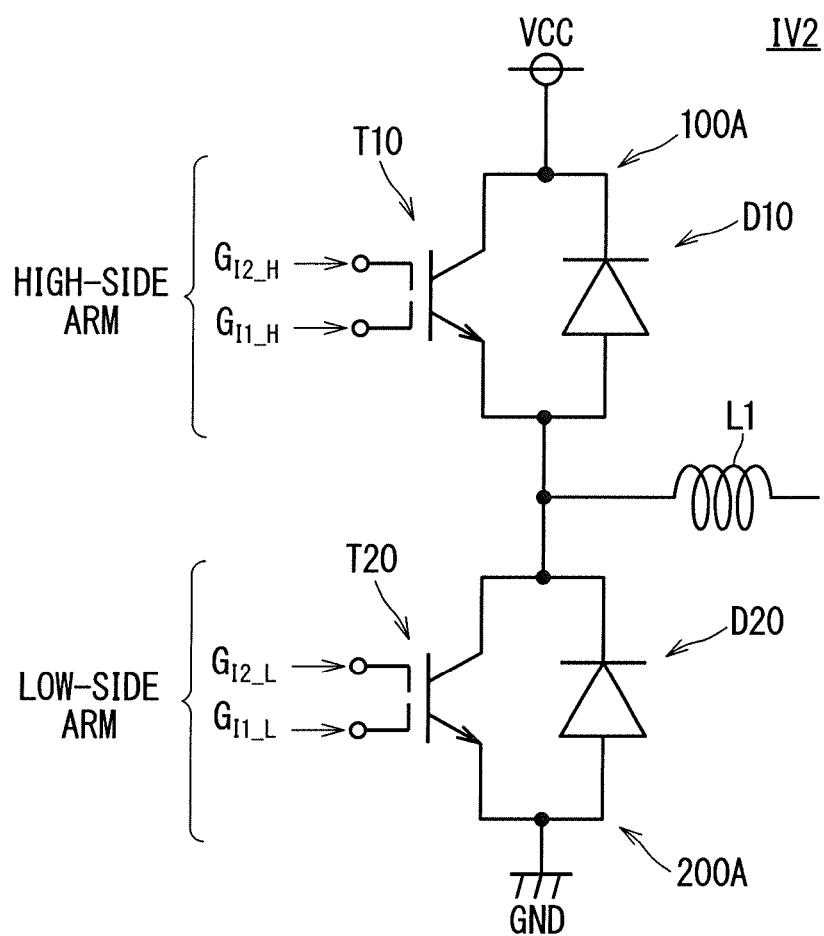
FIG. 18 is a circuit diagram illustrating a structure of an inverter circuit according to Embodiment 2.

FIG. 18 is a circuit diagram illustrating a structure of an inverter circuit IV2 of one phase according to Embodiment 2 of the present disclosure.

In the inverter circuit IV2 of FIG. 18, an RC-IGBT 100A (a first switching device) functioning as a high-side arm and an RC-IGBT 200A (a second switching device) functioning as a low-side arm are connected in series between the power supply potential VCC and the reference potential GND. A connection node between the RC-IGBT 100A and the RC-IGBT 200A is connected to the inductance load L1. The RC-IGBT 100A has a structure in which an IGBT region T10 controlled by a gate signal $G_{T1\_H}$ (a first gate signal) and a gate signal $G_{T2\_H}$ (a second gate signal) is connected in anti-parallel to a diode region D10.

Furthermore, the RC-IGBT 200A has a structure in which an IGBT region T20 controlled by a gate signal $G_{T1\_L}$ (a first gate signal) and a gate signal $G_{T2\_L}$ (a second gate signal) is connected in anti-parallel to a diode region D20.

Here, the gate signal $G_{T2\_H}$ is given to second gate trenches formed in the IGBT regions T10, whereas the gate signal $G_{T2\_L}$ is given to second gate trenches formed in the IGBT regions T20.

Thus, application of control signals such as the gate signal $G_{T2\_H}$ and the gate signal $G_{T2\_L}$ facilitates the control and can reduce the power loss more significantly than the structure in which each arm is controlled by one gate signal.

Figure 19:
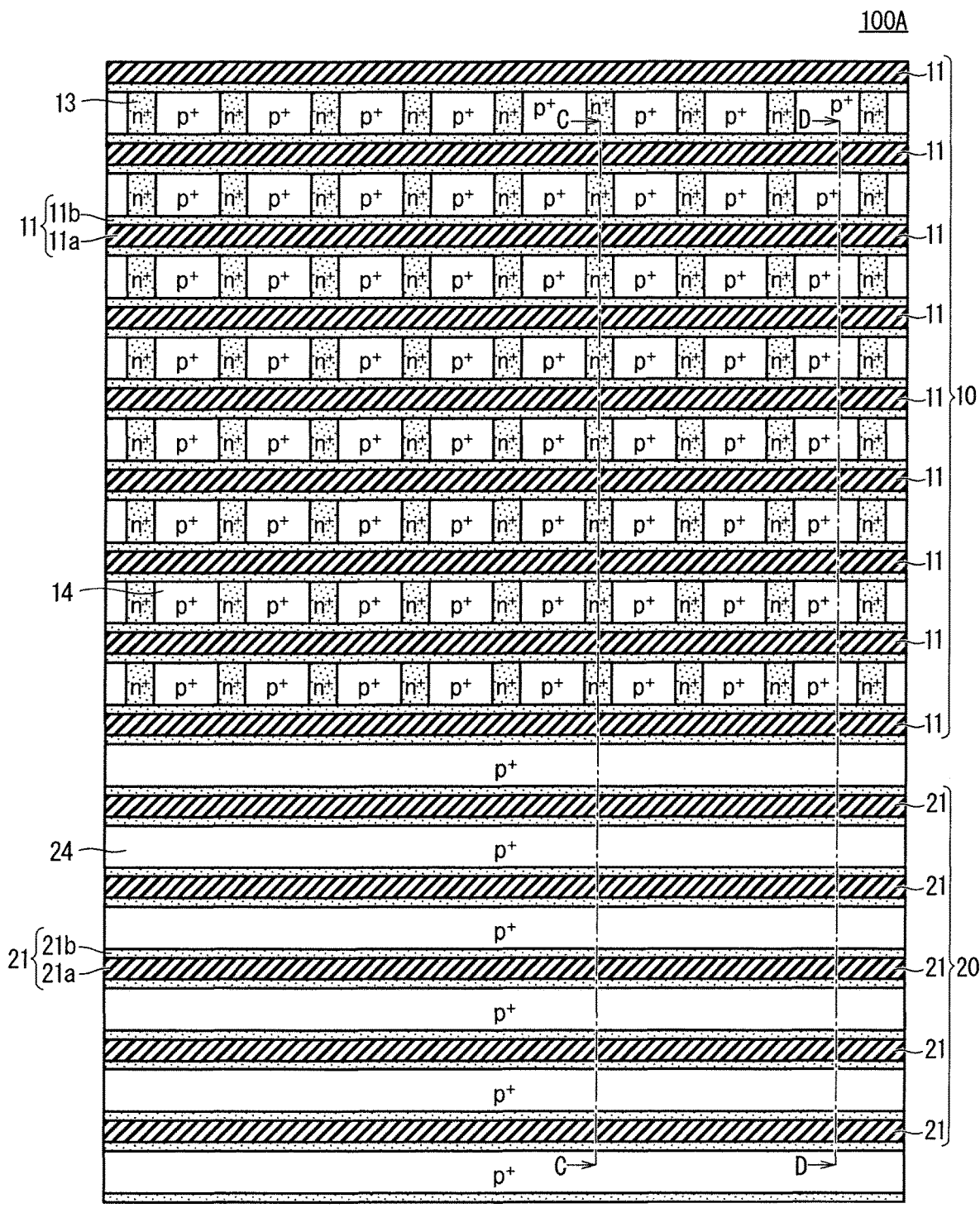
FIG. 19 is a plan view of an RC-IGBT in the inverter circuit according to Embodiment 2 when viewed from the top surface.
Figure 20:
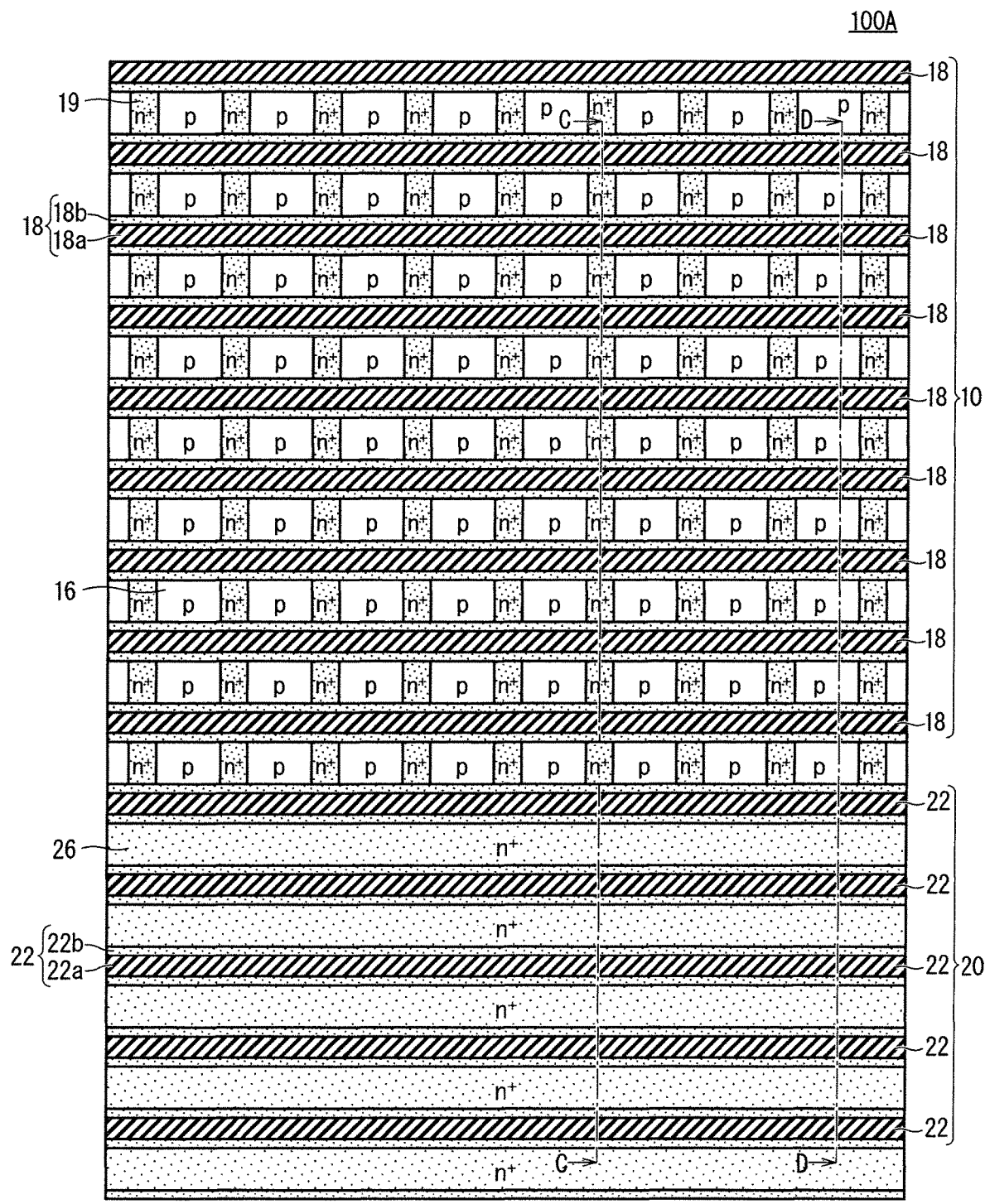
FIG. 20 is a plan view of the RC-IGBT in the inverter circuit according to Embodiment 2 when viewed from the bottom surface.

FIG. 19 is a plan view of the RC-IGBT 100A in the inverter circuit IV2 according to Embodiment 2 when viewed from the top surface. FIG. 20 is a plan view of the RC-IGBT 100A when viewed from the bottom surface. The IGBT region T10 will be referred to as an IGBT region 10, and the diode region D10 will be referred to as a diode region 20 in the following description for convenience.

As illustrated in FIG. 19, the RC-IGBT 100A consists of IGBT regions 10 and diode regions 20 that are arranged in stripes. The IGBT regions 10 are identical to those of the RC-IGBT 100 in FIG. 2. In the diode regions 20, however, only the $p^+$ type contact layer 24 is disposed between the two adjacent diode trench gates 21.

In FIG. 20, active trench gates 18 (second gates) are arranged in stripes on the bottom surface of the IGBT regions 10. The active trench gates 18 extend in the longitudinal direction of the IGBT region 10 which coincides with the longitudinal direction of the active trench gates 18.

Each of the active trench gates 18 is formed by embedding a gate trench electrode 18a through a gate trench insulating film 18b in a trench formed in a semiconductor substrate. The gate trench electrodes 18a of the active trench gates 18 are electrically connected to a gate pad (a second gate pad) that is not illustrated.

The p-type collector layer 16 is formed across both sides of the active trench gates 18 in the width direction to be in contact with the gate trench insulating films 18b. The p-type collector layer 16 is a semiconductor layer containing, for example, boron or aluminum as p-type impurities. A concentration of the p-type impurities ranges from $1.0 \times 10^{12}/cm^3$ to $1.0 \times 10^{19}/cm^3$. The p-type collector layers 16 and n' type collector layers 19 are alternately formed in the extension direction of the active trench gates 18.

Each of the $n^+$ type collector layers 19 is a semiconductor layer containing, for example, arsenic or phosphorus as n-type impurities. A concentration of the p-type impurities ranges from $1.0 \times 10^{17}/cm^3$ to $1.0 \times 10^{20}/cm^3$.

In FIG. 20, diode trench gates 22 are arranged in stripes on the bottom surface of the diode region 20. The diode trench gates 22 extend in the longitudinal direction of the diode region 20 which coincides with the longitudinal direction of the diode trench gates 22.

Each of the diode trench gates 22 is formed by embedding a diode trench electrode 22a through a diode trench insulating film 22b in a trench formed in the semiconductor substrate. The $n^+$ type cathode layer 26 is disposed between the two adjacent diode trench gates 22.

Figure 21:
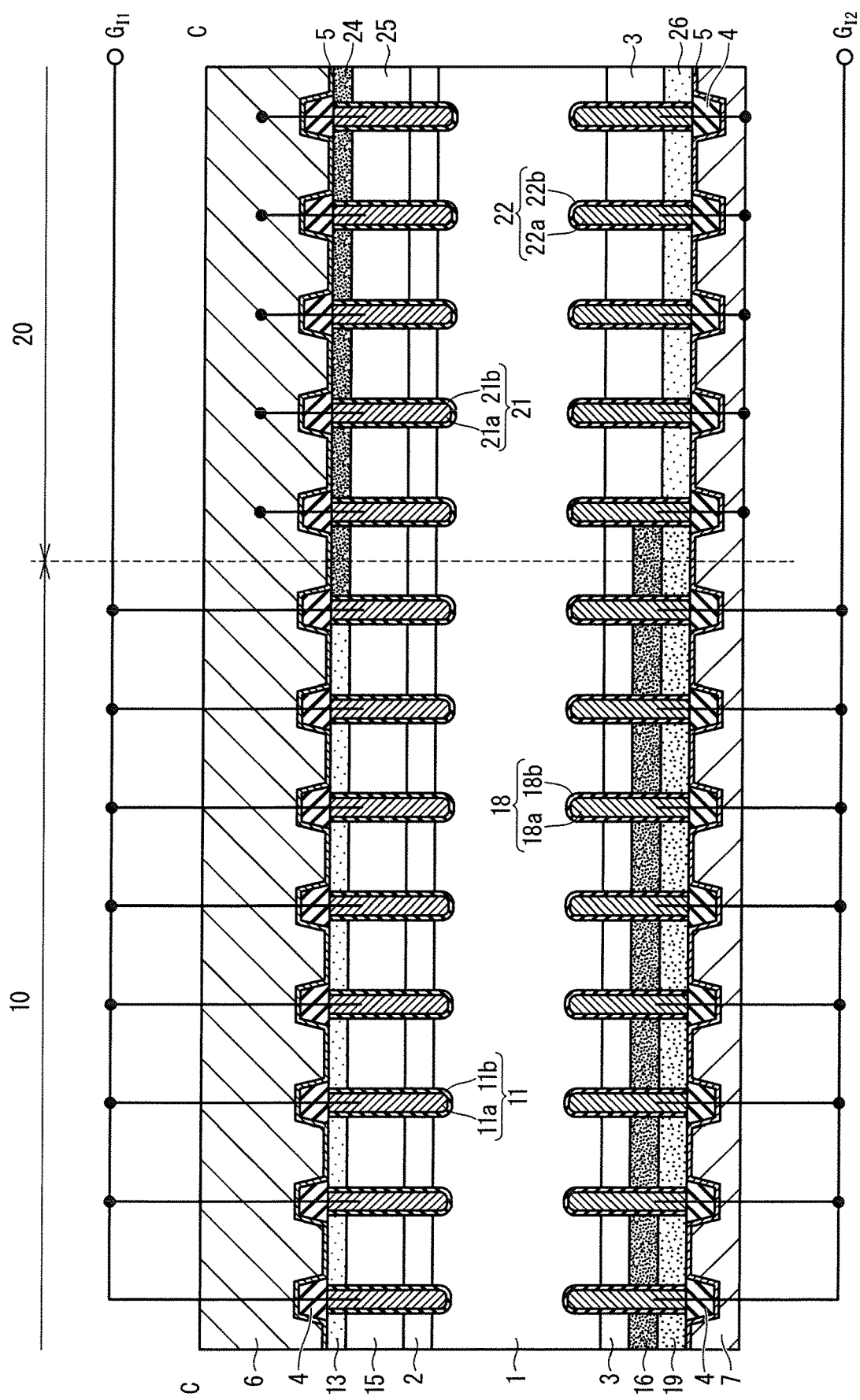
FIG. 21 is a cross-sectional view illustrating a structure of the RC-IGBT in the inverter circuit according to Embodiment 2.
Figure 22:
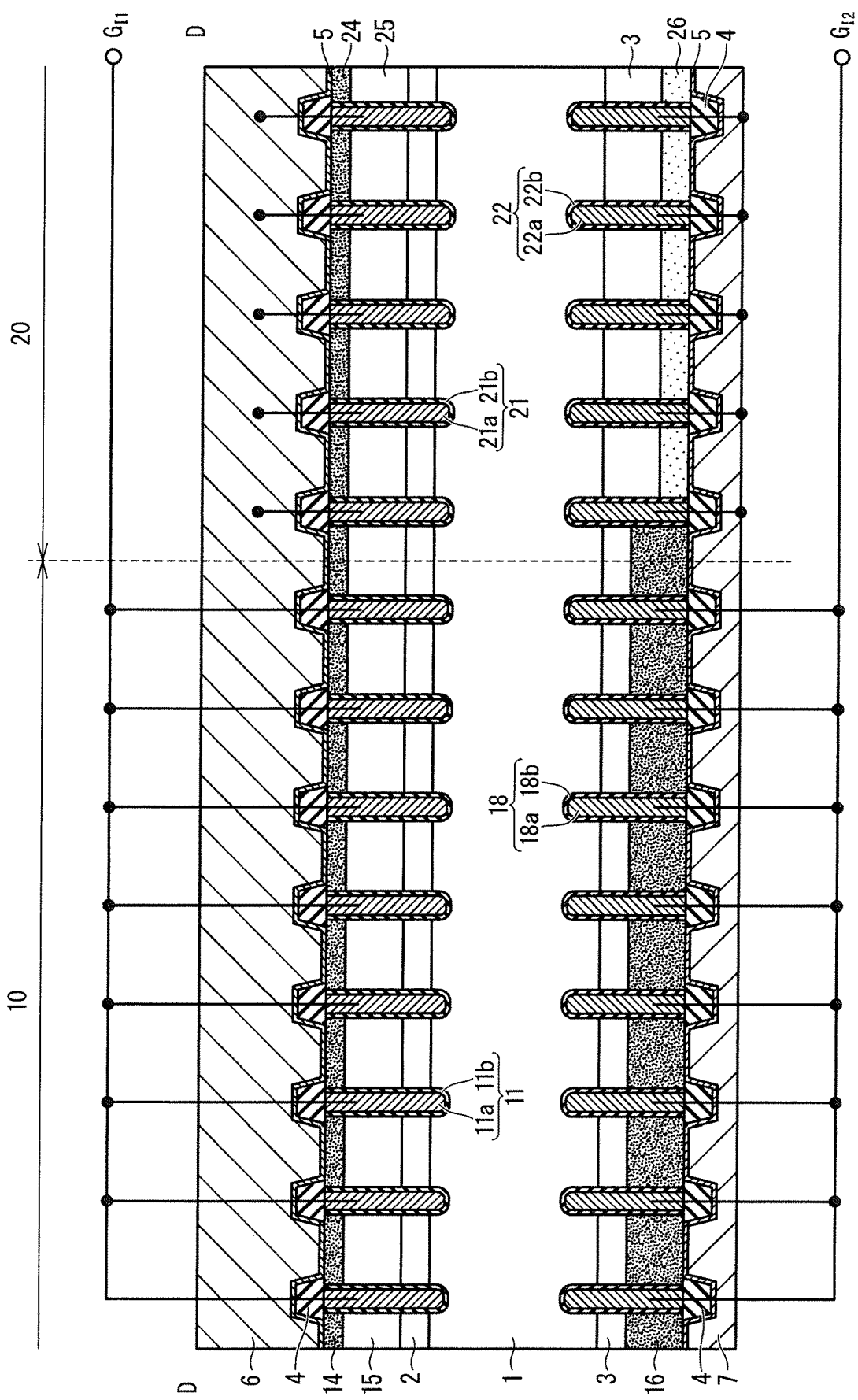
FIG. 22 is a cross-sectional view illustrating a structure of the RC-IGBT in the inverter circuit according to Embodiment 2.

FIG. 21 and FIG. 22 illustrate cross-sectional views taken along a broken line C-C and a broken line D-D, respectively, in the RC-IGBT 100A in FIGS. 19 and 20. The same reference numerals will be applied to the constituent elements identical to those of the RC-IGBT 100 in FIGS. 4 and 5, and the overlapping description will be omitted.

In FIG. 21, the n⁺ type collector layer 19, the p-type collector layer 16, and the n-type buffer layer 3 are formed in this order from the second principal surface of the semiconductor substrate in the lower surface of the IGBT region 10. These impurity layers are in contact with the gate trench insulating films 18b on both sides of the active trench gates 18 in the width direction. Furthermore, the bottom of the active trench gates 18 reaches the if type drift layer 1.

The interlayer insulating film 4 is disposed on the gate trench electrodes 18a of the active trench gates 18. The interlayer insulating film 4 on the gate trench electrodes 18a of the active trench gates 18 insulates the gate trench electrodes 18a from the collector electrode 7 so that the gate trench electrodes 18a receive the gate signal $G_{f2}$.

The barrier metal 5 is formed on a region without the interlayer insulating film 4 on the second principal surface of the semiconductor substrate, and on the interlayer insulating film 4.

In FIG. 21, the p⁺ type contact layer 24, the p-type anode layer 25, and the n-type carrier storage layer 2 are formed in this order from the first principal surface of the semiconductor substrate in the upper surface of the diode region 20. These impurity layers are in contact with the diode trench insulating films 21b on both sides of the diode trench gates 21 in the width direction. Furthermore, the bottom of the diode trench gates 21 reaches then type drift layer 1.

The interlayer insulating film 4 is disposed on the gate trench electrodes 21a of the diode trench gates 21. Although the interlayer insulating film 4 is formed on the diode trench electrodes 21a of the diode trench gates 21, the diode trench electrodes 21a are electrically connected to the emitter electrode 6.

The barrier metal 5 is formed on a region without the interlayer insulating film 4 on the first principal surface of the semiconductor substrate, and on the interlayer insulating film 4.

In FIG. 21, the n⁺ type cathode layer 26 and the n-type buffer layer 3 are formed in this order from the second principal surface of the semiconductor substrate in the lower surface of the diode region 20. These impurity layers are in contact with the diode trench insulating films 22b on both sides of the diode trench gates 22 in the width direction. Furthermore, the bottom of the diode trench gates 22 reaches then type drift layer 1.

The interlayer insulating film 4 is disposed on the diode trench electrodes 22a of the diode trench gates 22. Although the interlayer insulating film 4 is formed on the diode trench electrodes 22a of the diode trench gates 22, the diode trench electrodes 22a are electrically connected to the collector electrode 7.

In FIG. 22, the p⁺ type contact layer 14, the p-type base layer 15, and the n-type carrier storage layer 2 are formed in this order from the first principal surface of the semiconductor substrate in the upper surface of the IGBT region 10. These impurity layers are in contact with the gate trench insulating films 11b on both sides of the active trench gates 11 in the width direction. Furthermore, the bottom of the active trench gates 11 reaches the n⁻ type drift layer 1.

In FIG. 22, the p-type collector layer 16 and the n-type buffer layer 3 are formed in this order from the second principal surface of the semiconductor substrate in the lower surface of the IGBT region 10. These impurity layers are in contact with the gate trench insulating films 18b on both sides of the active trench gates 18 in the width direction. Furthermore, the bottom of the active trench gates 18 reaches the n⁻ type drift layer 1.

The turn off loss can be significantly reduced in the IGBT regions in the aforementioned inverter circuit IV2 according to Embodiment 2, in a relatively easy control method for controlling only the active trench gates 11 and 18. This mechanism will be described later.

The diode trench gates 21 are formed in the upper surface of the diode region 20, the diode trench gates 22 are formed in the lower surface of the diode region 20, and the diode trench electrodes 21a and the diode trench electrodes 22a are fixed to potentials of the emitter electrode 6 and the collector electrode 7, respectively. Thus, the diode trench gates 21 and 22, which do not actively function, can make the arrangement of the trenches uniform, reduce occurrence of partial high electric fields from a non-uniform structure, and easily increase the withstand voltage. The active trench gates 11 in the upper surface of the IGBT region 10 need not face the active trench gates 18 in the lower surface of the IGBT region 10. The number of the active trench gates 11 need not be identical to that of the active trench gates 18. Similarly, the diode trench gates 21 in the upper surface of the diode region 20 need not face the diode trench gates 22 in the lower surface of the diode region 20. The number of the diode trench gates 21 need not be identical to that of the diode trench gates 22.

Embodiment 3

[Device Structure]

Figure 23:
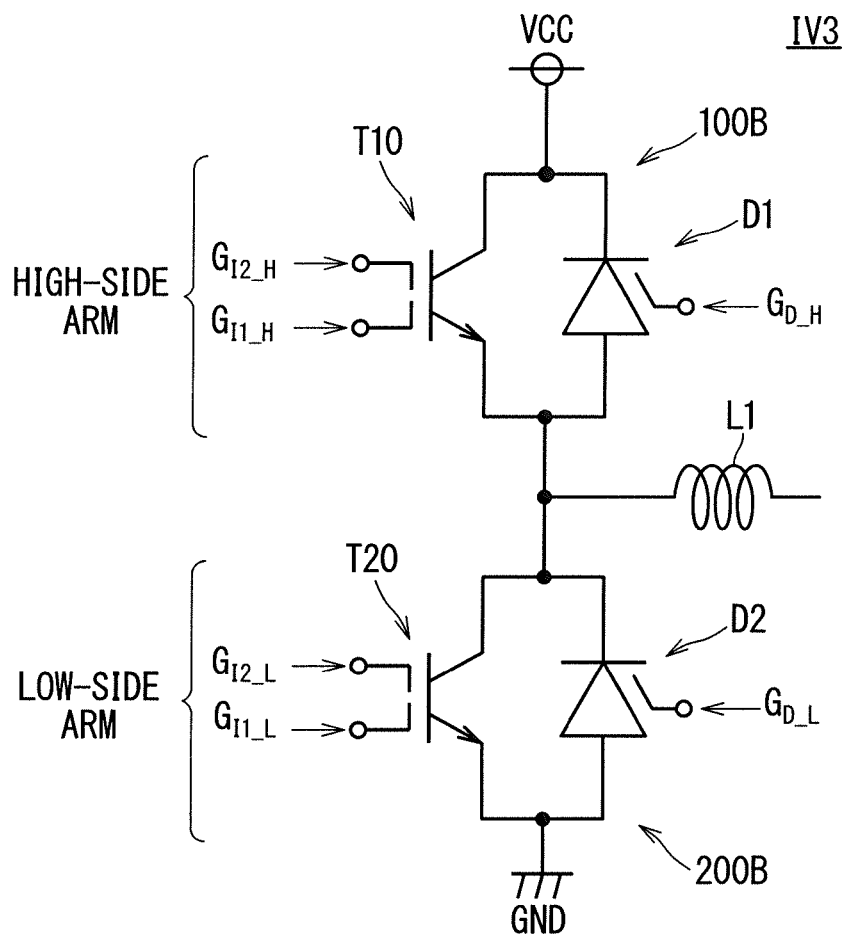
FIG. 23 is a circuit diagram illustrating a structure of an inverter circuit according to Embodiment 3.

FIG. 23 is a circuit diagram illustrating a structure of an inverter circuit IV3 of one phase according to Embodiment 3 of the present disclosure.

In the inverter circuit IV3 of FIG. 23, an RC-IGBT 100B (a first switching device) functioning as a high-side arm and an RC-IGBT 200B (a second switching device) functioning as a low-side arm are connected in series between the power supply potential VCC and the reference potential GND. A connection node between the RC-IGBT 100B and the RC-IGBT 200B is connected to the inductance load L1. The RC-IGBT 100B has a structure in which the IGBT region T10 controlled by the gate signal $G_{f1\_H}$ (first gate signal) and the gate signal $G_{f2\_H}$ (second gate signal) is connected in anti-parallel to the diode region D1 controlled by the gate signal $G_{D\_H}$ (diode gate signal).

Furthermore, the RC-IGBT 200B has a structure in which the IGBT region T20 controlled by the gate signal $G_{f1\_L}$ (first gate signal) and the gate signal $G_{f2\_L}$ (second gate signal) is connected in anti-parallel to the diode region D2 controlled by the gate signal $G_{D\_L}$ (diode gate signal).

Here, the gate signal $G_{f2\_H}$ is given to second gate trenches formed in the IGBT region T10, whereas the gate signal $G_{f2\_L}$ is given to second gate trenches formed in the IGBT region T20. Furthermore, the gate signal $G_{D\_H}$ is given to diode trenches formed in the diode region D1, whereas the gate signal $G_{D\_L}$ is given to diode trenches formed in the diode region D2.

Thus, application of control signals such as the gate signal $G_{f2\_H}$, the gate signal $G_{f2\_L}$, the gate signal $G_{D\_H}$, and the gate signal $G_{D\_L}$ facilitates the control and can reduce the power loss more significantly than the structure in which each arm is controlled by one gate signal.

Figure 24:
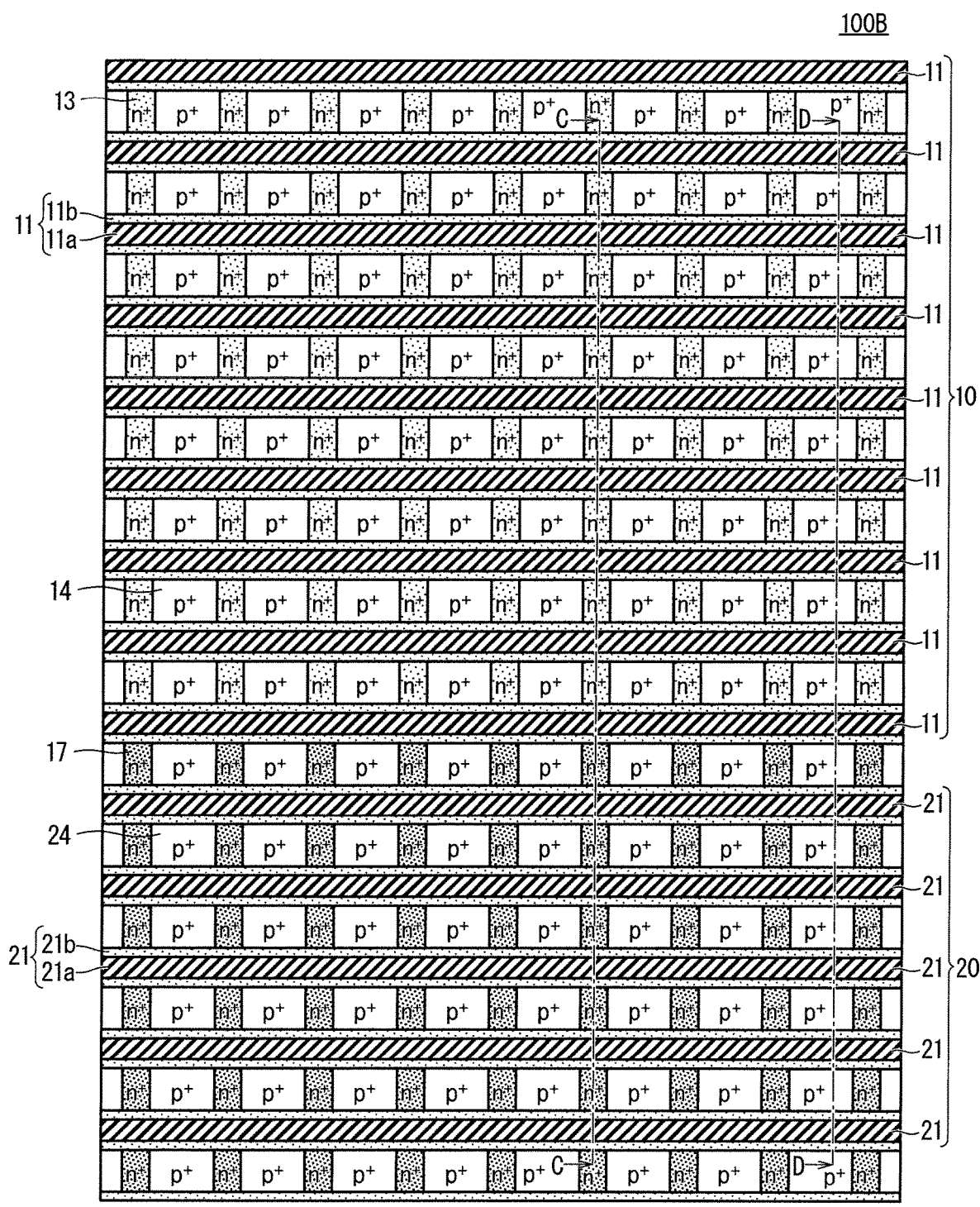
FIG. 24 is a plan view of an RC-IGBT in the inverter circuit according to Embodiment 3 when viewed from the top surface.
Figure 25:
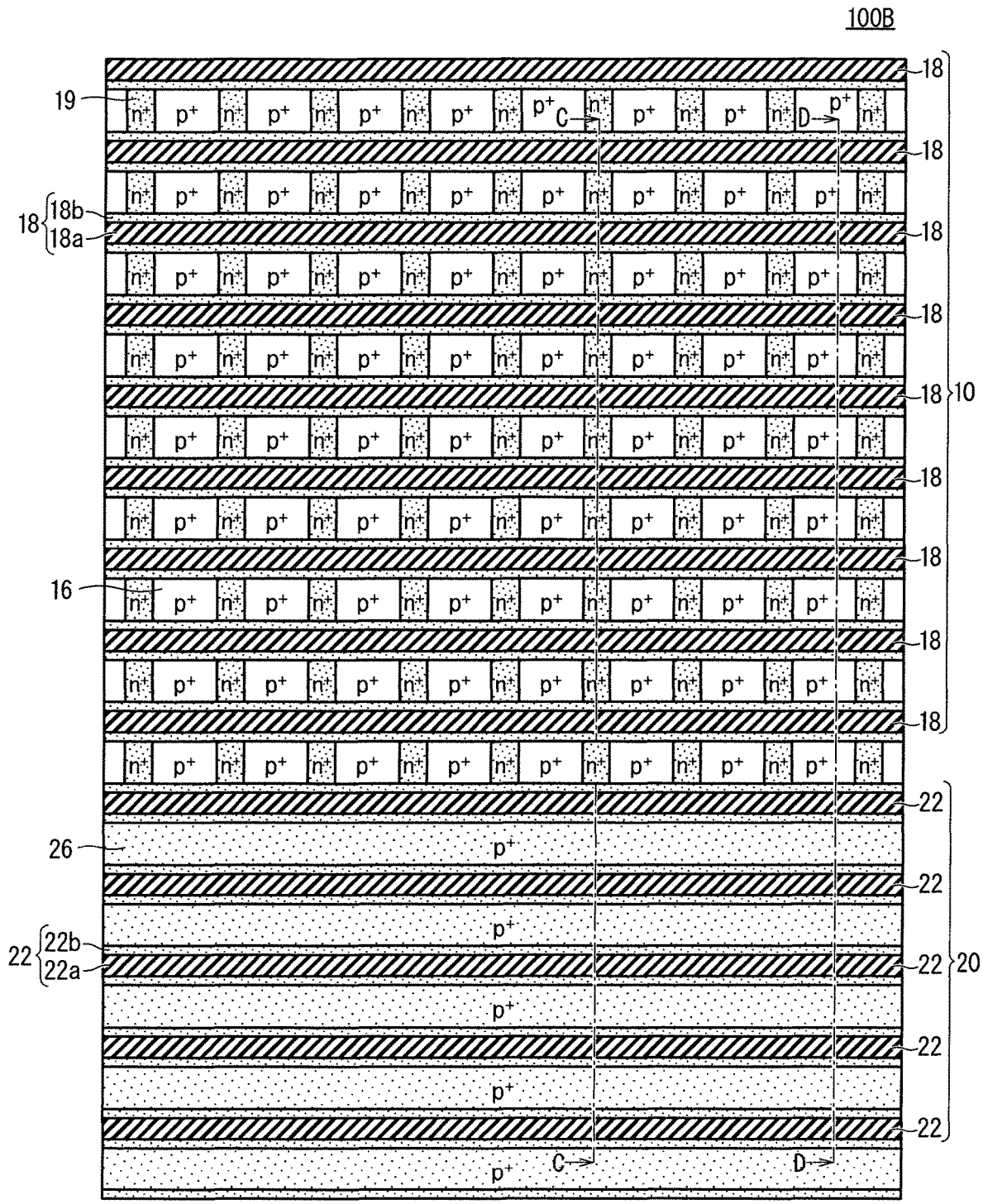
FIG. 25 is a plan view of the RC-IGBT in the inverter circuit according to Embodiment 3 when viewed from the bottom surface.

FIG. 24 is a plan view of the RC-IGBT 100B in the inverter circuit IV3 according to Embodiment 3 when viewed from the top surface. FIG. 25 is a plan view of the RC-IGBT 100B when viewed from the bottom surface. The IGBT region T10 will be referred to as an IGBT region 10, and the diode region D1 will be referred to as a diode region 20 in the following description for convenience.

As illustrated in FIG. 24, the top-surface structure of the RC-IGBT 100B is identical to that of the RC-IGBT 100 according to Embodiment 1 in FIG. 2. Furthermore, the bottom-surface structure of the RC-IGBT 100B is identical to that of the RC-IGBT 100A according to Embodiment 2 in FIG. 20.

Figure 26:
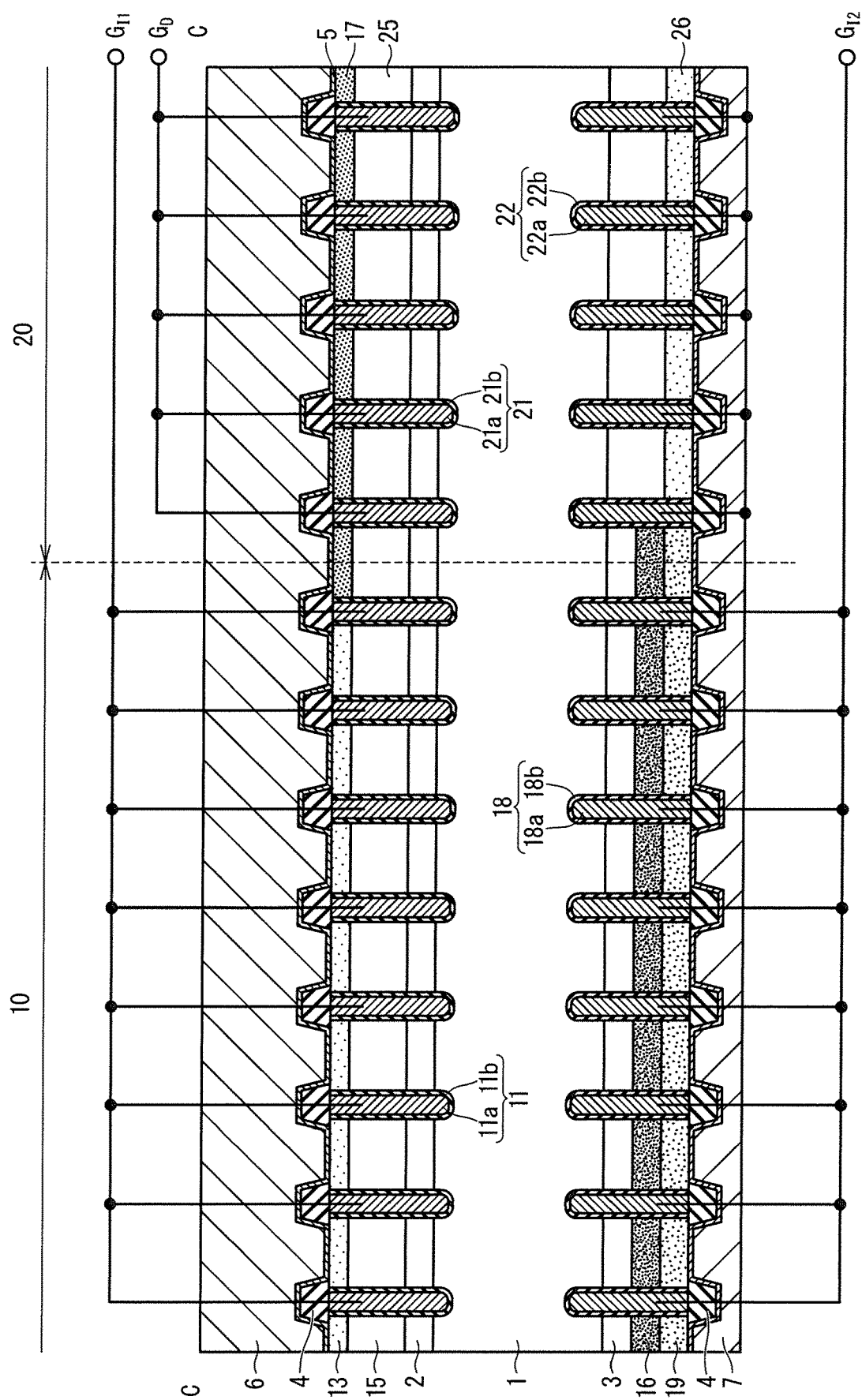
FIG. 26 is a cross-sectional view illustrating a structure of the RC-IGBT in the inverter circuit according to Embodiment 3.
Figure 27:
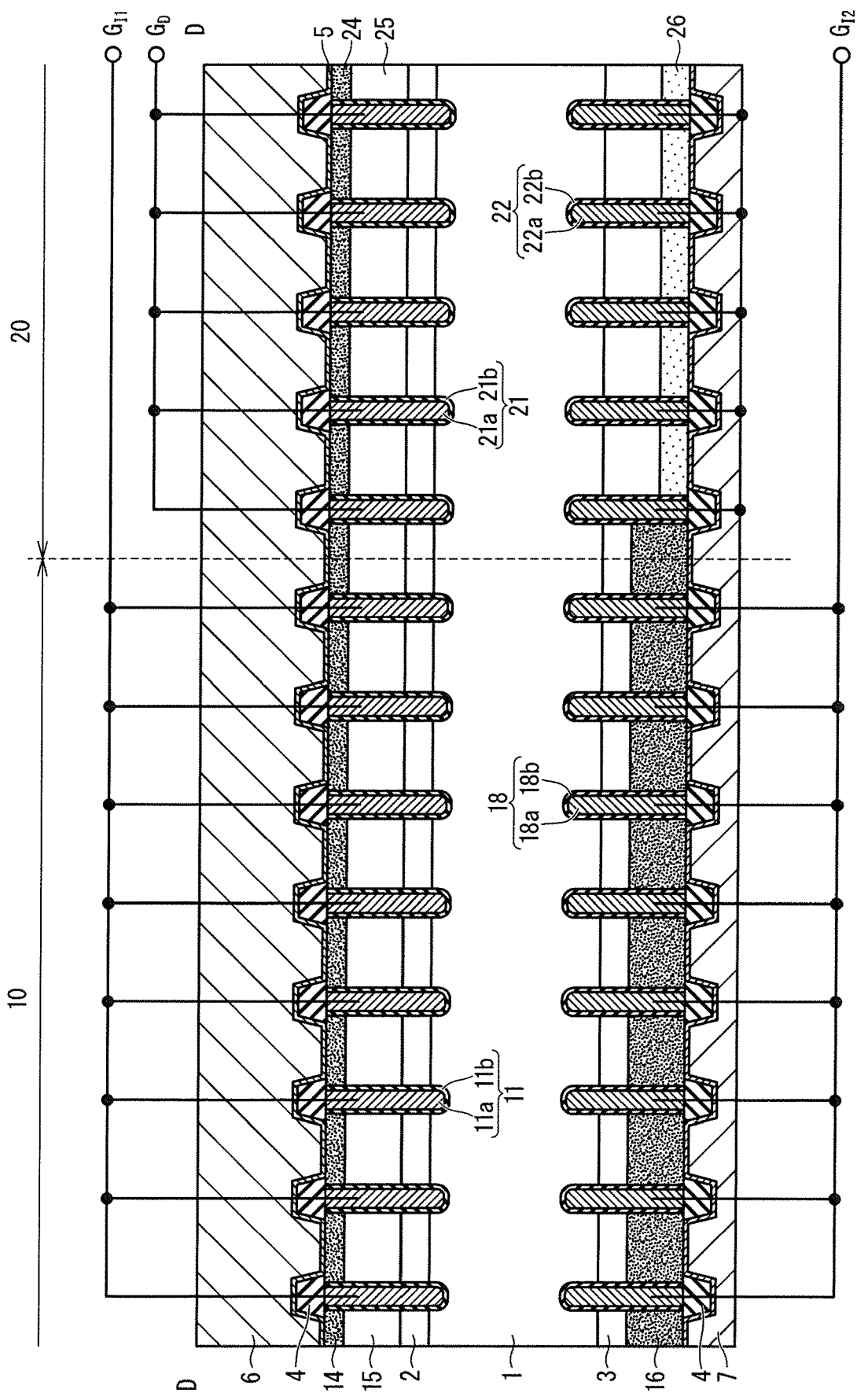
FIG. 27 is a cross-sectional view illustrating a structure of the RC-IGBT in the inverter circuit according to Embodiment 3.

FIG. 26 and FIG. 27 illustrate cross-sectional views taken along a broken line C-C and a broken line D-D, respectively, in the RC-IGBT 100B in FIGS. 24 and 25. Although the cross-sectional structure in FIG. 26 is basically identical to that of the RC-IGBT 100A according to Embodiment 2 in FIG. 21, the type contact layers 17, the p-type anode layer 25, and the n-type carrier storage layer 2 are formed in this order from the first principal surface of the semiconductor substrate in the upper surface of the diode region 20 in FIG. 26. These impurity layers are in contact with the diode trench insulating films 21b on both sides of the diode trench gates 21 in the width direction. Furthermore, the bottom of the diode trench gates 21 reaches then type drift layer 1. The diode trench electrodes 21a have a structure of receiving the gate signal $G_D$. The active trench gates 11 in the upper surface of the IGBT region 10 need not face the active trench gates 18 in the lower surface of the IGBT region 10. The number of the active trench gates 11 need not be identical to that of the active trench gates 18. Similarly, the diode trench gates 21 in the upper surface of the diode region 20 need not face the diode trench gates 22 in the lower surface of the diode region 20. The number of the diode trench gates 21 need not be identical to that of the diode trench gates 22.

Although the cross-sectional structure in FIG. 27 is basically identical to that of the RC-IGBT 100A according to Embodiment 2 in FIG. 22, the diode trench electrodes 21a have a structure of receiving the gate signal $G_D$.

In the inverter circuit IV3 according to Embodiment 3, the active trench gates 11 are formed in the upper surface of the IGBT region 10, the active trench gates 18 are formed in the lower surface of the IGBT region 10, the diode trench gates 21 are formed in the upper surface of the diode region 20, the diode trench gates 22 are formed in the lower surface of the diode region 20, and the gate signal $G_D$ is given to the diode trench gates 21 to control the RC-IGBT 100B. The turn off loss in the IGBT regions and the reverse recovery loss in the diode regions can be significantly reduced in a relatively easy control method under this structure. This mechanism will be described later.

[Modification]

Figure 28:
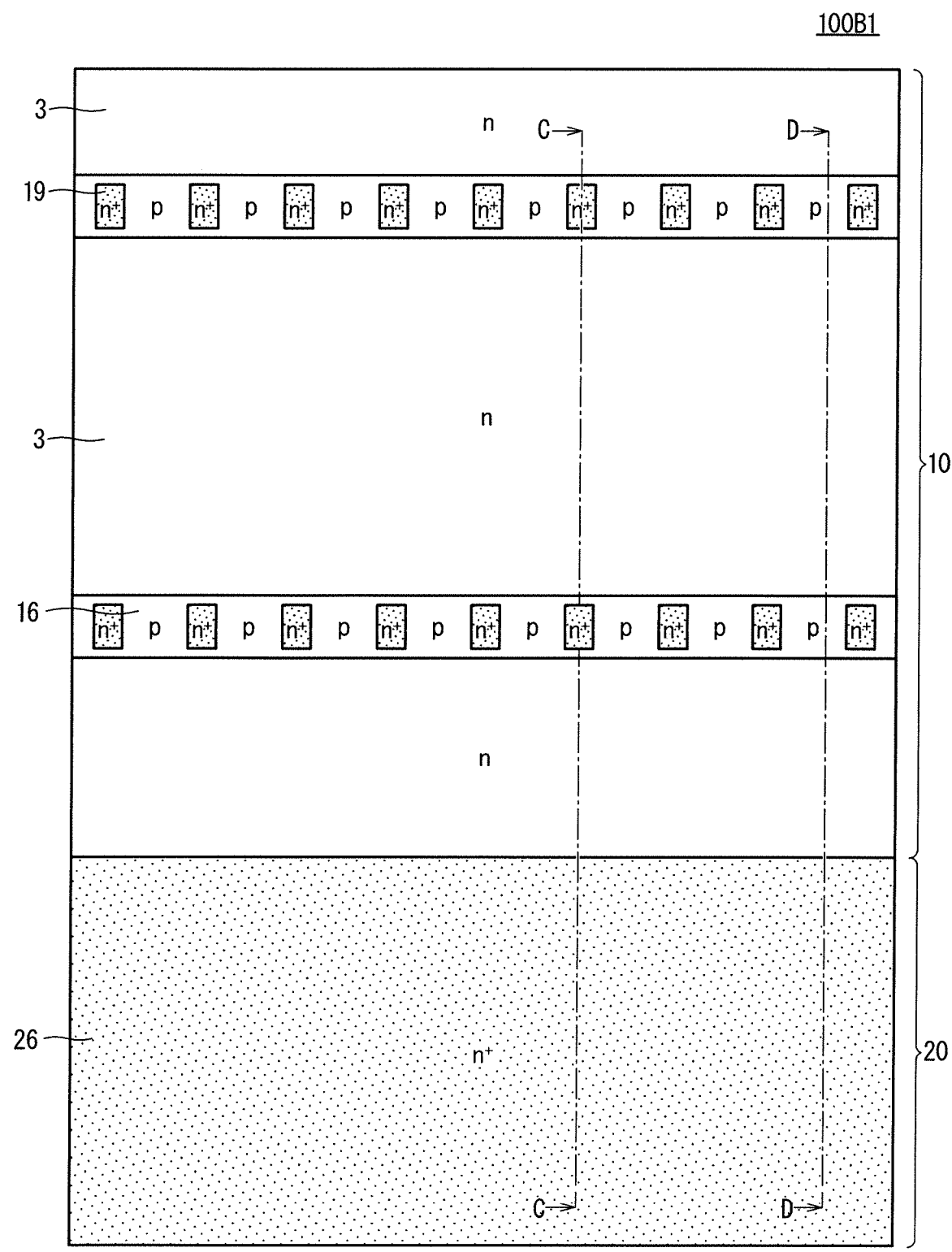
FIG. 28 is a plan view of an RC-IGBT in an inverter circuit according to a modification of Embodiment 3 when viewed from the bottom surface.
Figure 29:
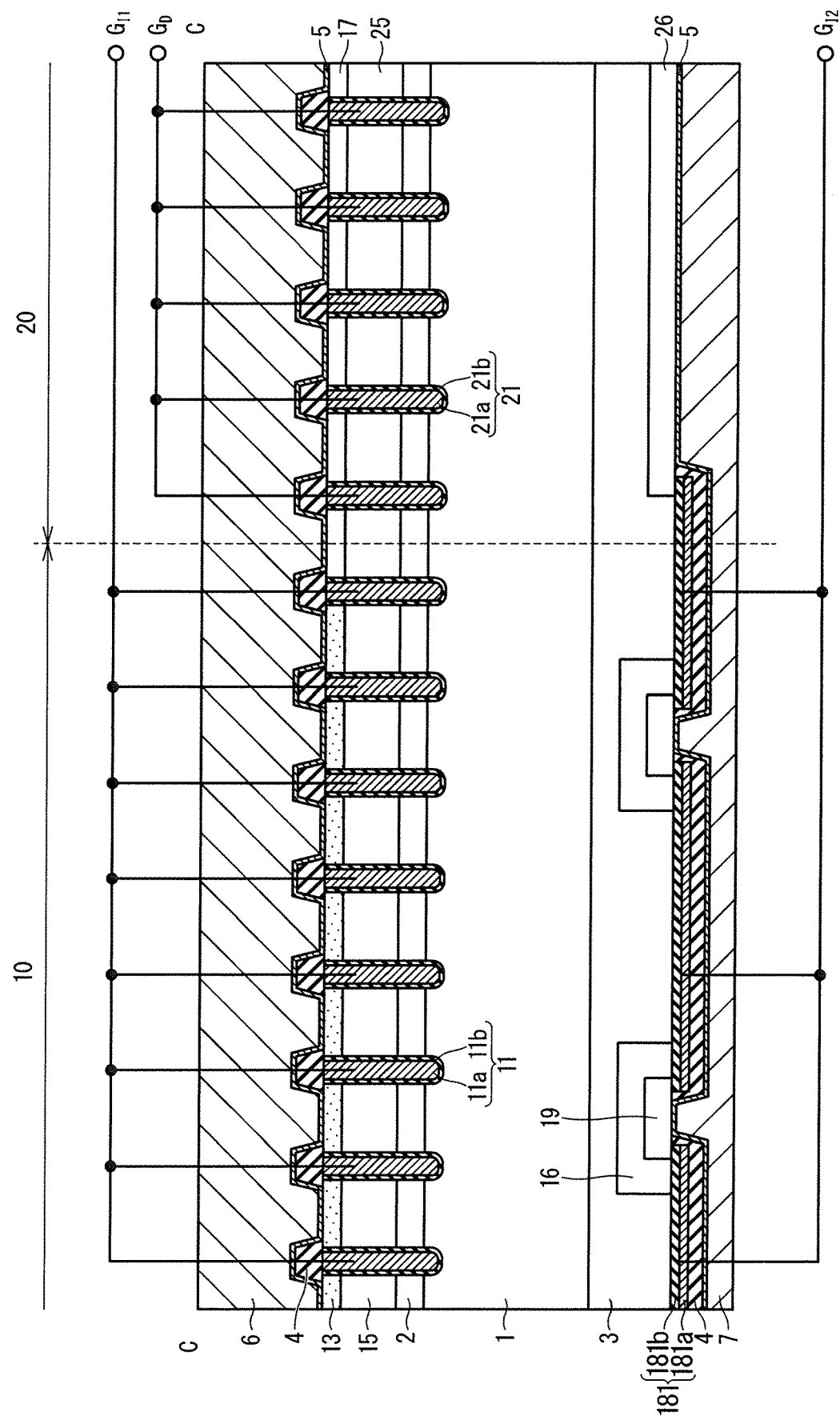
FIG. 29 is a cross-sectional view of a structure of the RC-IGBT in the inverter circuit according to the modification of Embodiment 3.
Figure 30:
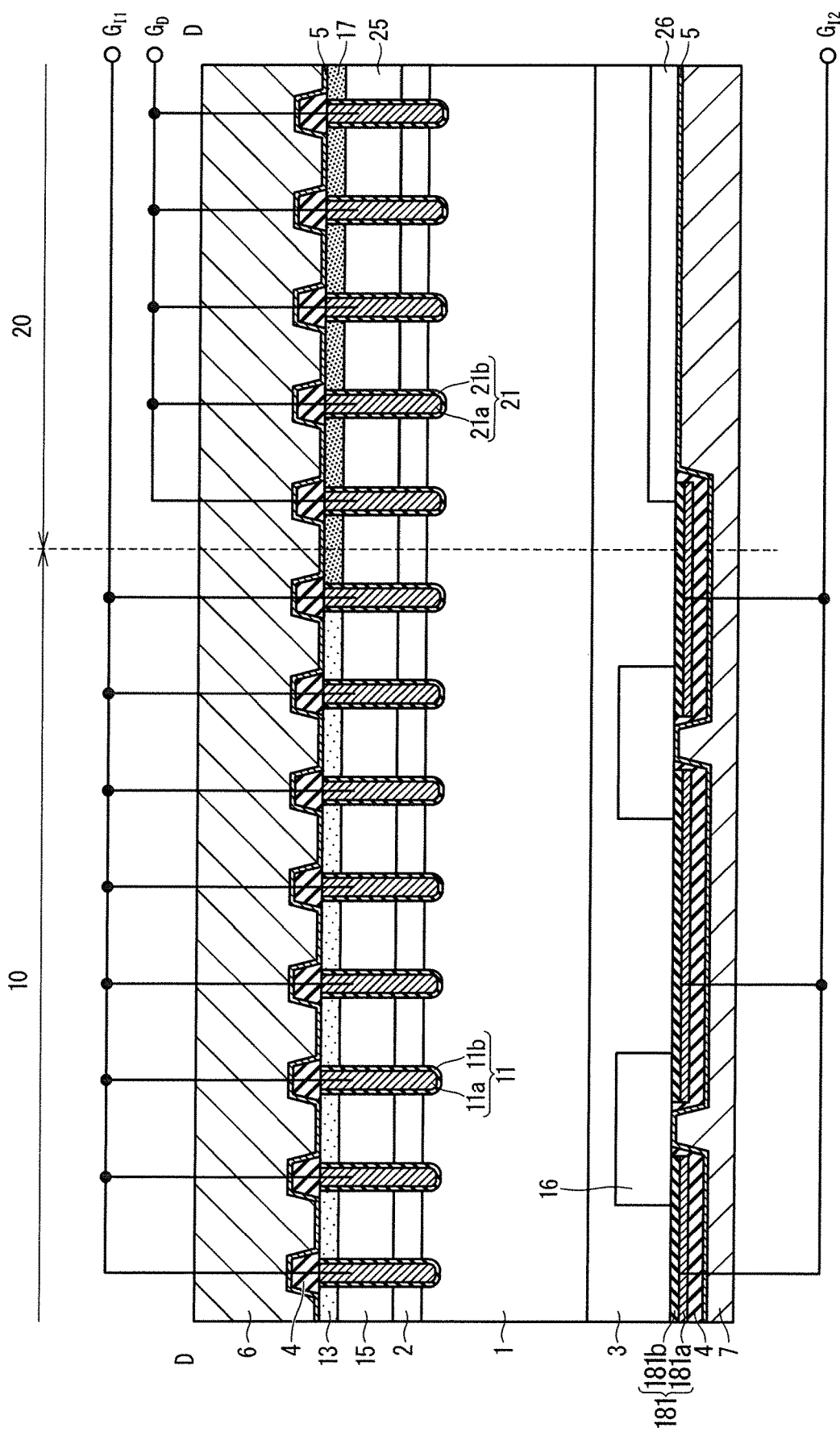
FIG. 30 is a cross-sectional view of the structure of the RC-IGBT in the inverter circuit according to the modification of Embodiment 3.

Next, an RC-IGBT 100B1 according to a modification of Embodiment 3 will be described with reference to FIGS. 28 to 30. FIG. 28 is a plan view of the RC-IGBT 100B1 when viewed from the bottom surface. FIG. 29 and FIG. 30 illustrate cross-sectional views taken along a broken line C-C and a broken line D-D, respectively, in FIG. 28. The top-surface structure of the RC-IGBT 100B1 is identical to that of FIG. 24.

On the bottom surface of the IGBT region 10 in FIG. 28, a plurality of p-type collector layers 16 are arranged in stripes, and a plurality of n$^+$ type collector layers 19 are arranged such that the p-type collector layers 16 surround the respective n$^+$ type collector layers 19. The n-type buffer layer 3 is a region sandwiched by the p-type collector layers 16.

In FIG. 28, the n$^+$ type cathode layer 26 is formed all over in the lower surface of the diode region 20.

Although the cross-sectional structure of the upper surface of the IGBT region in FIG. 29 is identical to that of FIG. 26, a planar gate 181 is formed in the lower surface of the IGBT region 10, instead of the active trench gates 18. The planar gate 181 includes gate insulating films 181b each between ends of the adjacent n$^+$ type collector layers 19, and gate electrodes 181a disposed on the gate insulating films 181b. The gate electrodes 181a are covered with the interlayer insulating film 4 to insulate the gate electrodes 181a from the collector electrode 7 so that the gate electrodes 181a receives the gate signal $G_{I2}$. The active trench gates 11 in the upper surface of the IGBT region 10 can be replaced with a planar gate.

Furthermore, the n$^+$ type cathode layer 26 is formed in the lower surface of the diode region 20. The barrier metal 5 is formed on the n$^+$ type cathode layer 26, the interlayer insulating film 4, and a region without the interlayer insulating film 4, and the collector electrode 7 is formed on the barrier metal 5.

Although the cross-sectional structure in FIG. 30 is basically identical to that in FIG. 29, this structure excludes the n$^+$ type collector layers 19 in the p-type collector layers 16.

The aforementioned RC-IGBT 100B1 includes the planar gate 181 instead of the active trench gates 18. Such a structure can significantly reduce the turn off loss in the IGBT regions and the reverse recovery loss in the diode regions.

[Operations]

Figure 31:
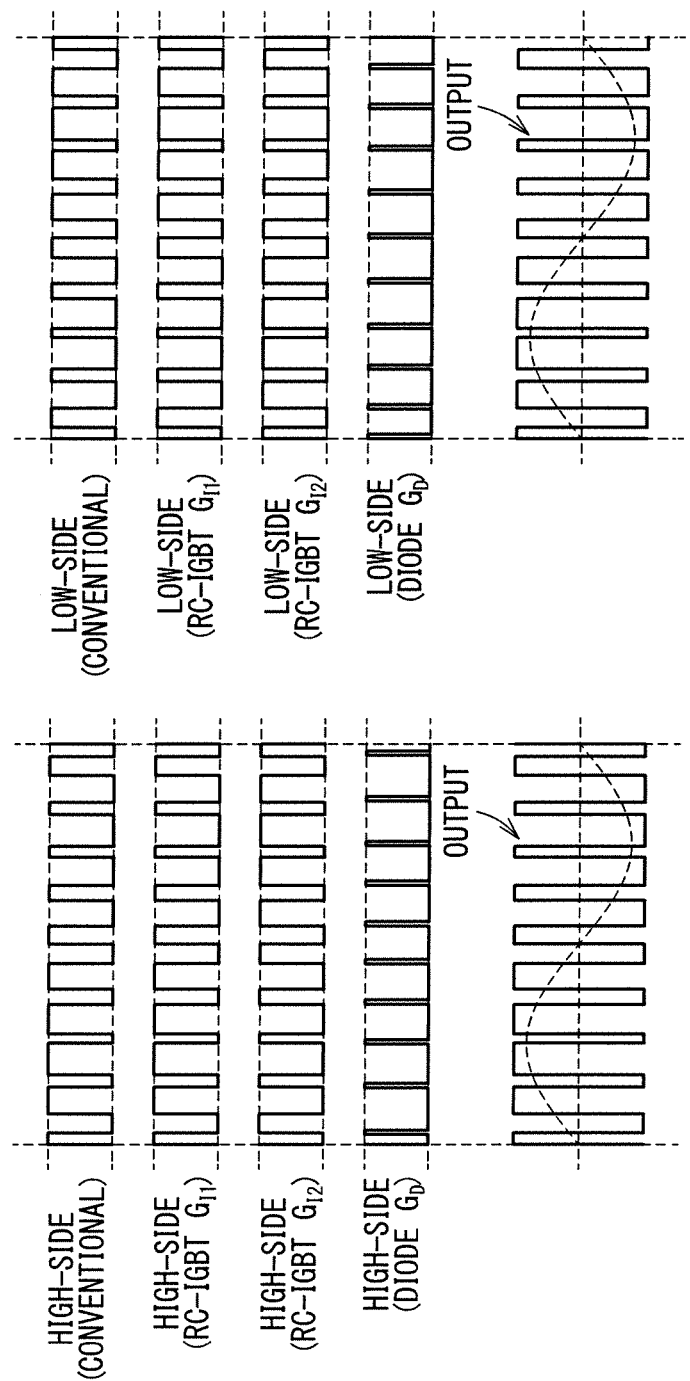
FIG. 31 illustrates timing charts to be used for controlling the inverter circuit according to Embodiment 3.

Next, the gate control in the RC-IGBT 100B will be described with reference to FIGS. 31 to 39. FIG. 31 illustrates timing charts of the gate control in the RC-IGBT 100B functioning as the high-side arm in the inverter circuit IV3 in FIG. 23 in a left diagram, and timing charts of the gate control in the RC-IGBT 200B functioning as the low-side arm in the same circuit in a right diagram. FIGS. 32 to 39 schematically illustrate an amount of injected holes using the size of an arrow.

In the left diagram of FIG. 31, a top tier illustrates a timing chart of a gate signal given to an RC-IGBT functioning as a high-side arm in a conventional inverter circuit, and the second tier from the top illustrates a timing chart of the gate signal Gil given to the active trench gates 11 in the IGBT regions. The third tier from the top illustrates a timing chart of the gate signal $G_{I2}$ given to the active trench gates 18 in the IGBT regions, the fourth tier from the top illustrates a timing chart of the gate signal $G_D$ given to the diode trench gates 21 in the diode regions, and the bottom tier illustrates a timing chart of the output of the inverter circuit IV3.

In the right diagram of FIG. 31, the top tier illustrates a timing chart of a gate signal given to an RC-IGBT functioning as a low-side arm in the conventional inverter circuit, and the second tier from the top illustrates a timing chart of the gate signal Gil given to the active trench gates 11 in the IGBT regions. The third tier from the top illustrates a timing chart of the gate signal $G_{I2}$ given to the active trench gates 18 in the IGBT regions, the fourth tier from the top illustrates a timing chart of the gate signal $G_D$ given to the diode trench gates 21 in the diode regions, and the bottom tier illustrates a timing chart of the output of the inverter circuit IV3.

As illustrated in FIG. 31, the RC-IGBT 100B and the RC-IGBT 200B are PWM controlled. Each of the active trench gates 11 and 18 in the IGBT regions receives pulse signals inverted between the high-side arm and the low-side arm according to PMW signals. The diode trench gates 21 in the diode regions receive a pulse signal generated with respect to the gate signal $G_{f1}$ given to the active trench gates 11.

Since the RC-IGBT 100B and the RC-IGBT 200B have the same structure, the following will describe the RC-IGBT 100B as an example. Each of FIGS. 32 to 39 illustrates a timing chart of the RC-IGBT 100B in a left diagram, and a cross-sectional view of the RC-IGBT 100B corresponding to that in FIG. 26 in a right diagram.

Figure 32:
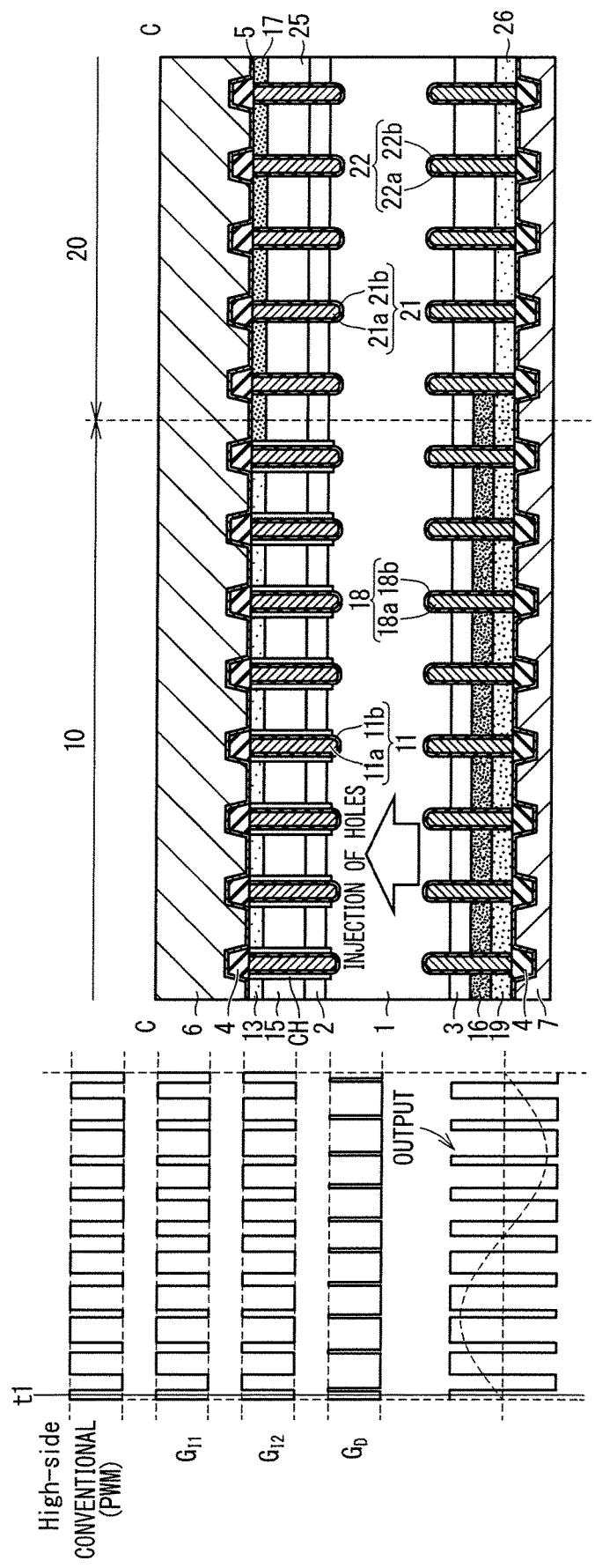
FIG. 32 illustrates the control in the inverter circuit according to Embodiment 3.

FIG. 32 illustrates a carrier state in the RC-IGBT 100B in the right diagram, at a time t1 in the timing chart in the left diagram. At the time t1, the IGBT region 10 is brought into forward conduction, and only the active trench gates 11 closer to the emitter electrode 6 in the IGBT region 10 are ON. When the collector electrode 7 injects holes, the IGBT region 10 is brought into forward conduction through channel layers CH formed on the side surfaces of the active trench gates 11.

Figure 33:
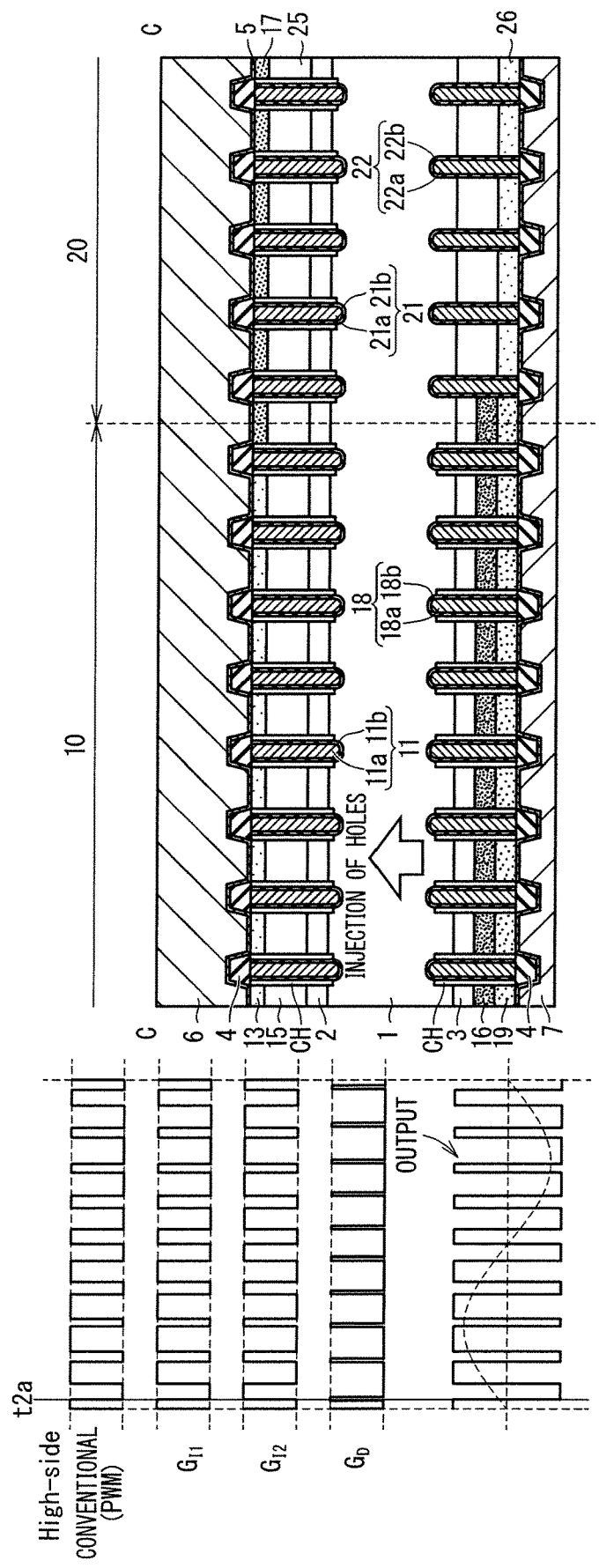
FIG. 33 illustrates the control in the inverter circuit according to Embodiment 3.

FIG. 33 illustrates a carrier state in the RC-IGBT 100B in the right diagram, at a time t2a in the timing chart in the left diagram. At the time t2a, turning off the IGBT region is prepared, and the diode trench gates 21 in the diode region 20 and also the active trench gates 18 are ON. Thus, injection of holes from the lower surface decreases.

Figure 34:
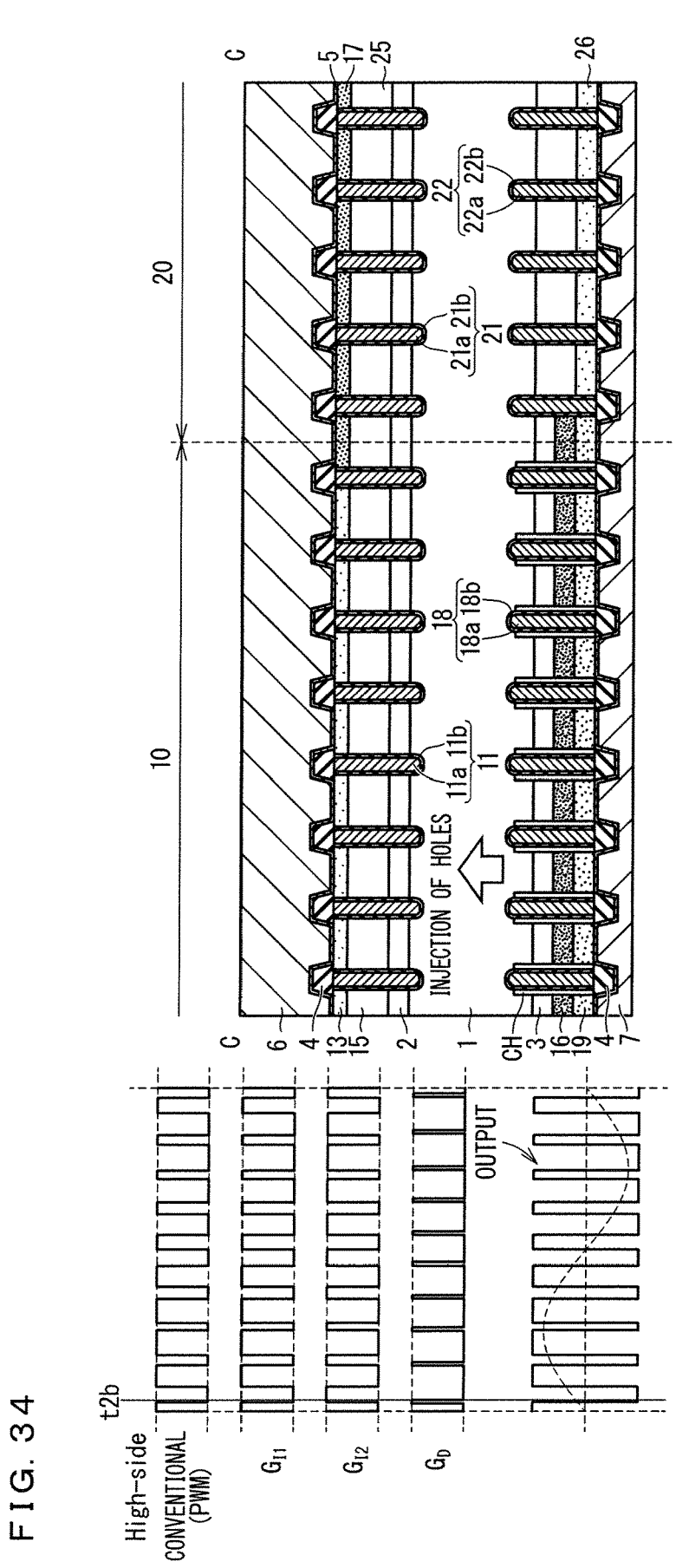
FIG. 34 illustrates the control in the inverter circuit according to Embodiment 3.

FIG. 34 illustrates a carrier state in the RC-IGBT 100B in the right diagram, at a time t2b in the timing chart in the left diagram. At the time t2b, the IGBT region 10 is turned off, and the active trench gates 11 and the diode trench gates 21 are also OFF. However, since the collector electrode 7 continues to inject holes until the diode region 20 that is an opposite arm of the IGBT region 10 conducts, the IGBT region 10 is continuously brought into forward conduction. Since the active trench gates 18 are ON, injection of holes decreases. This consequently reduces the turn off loss.

Figure 35:
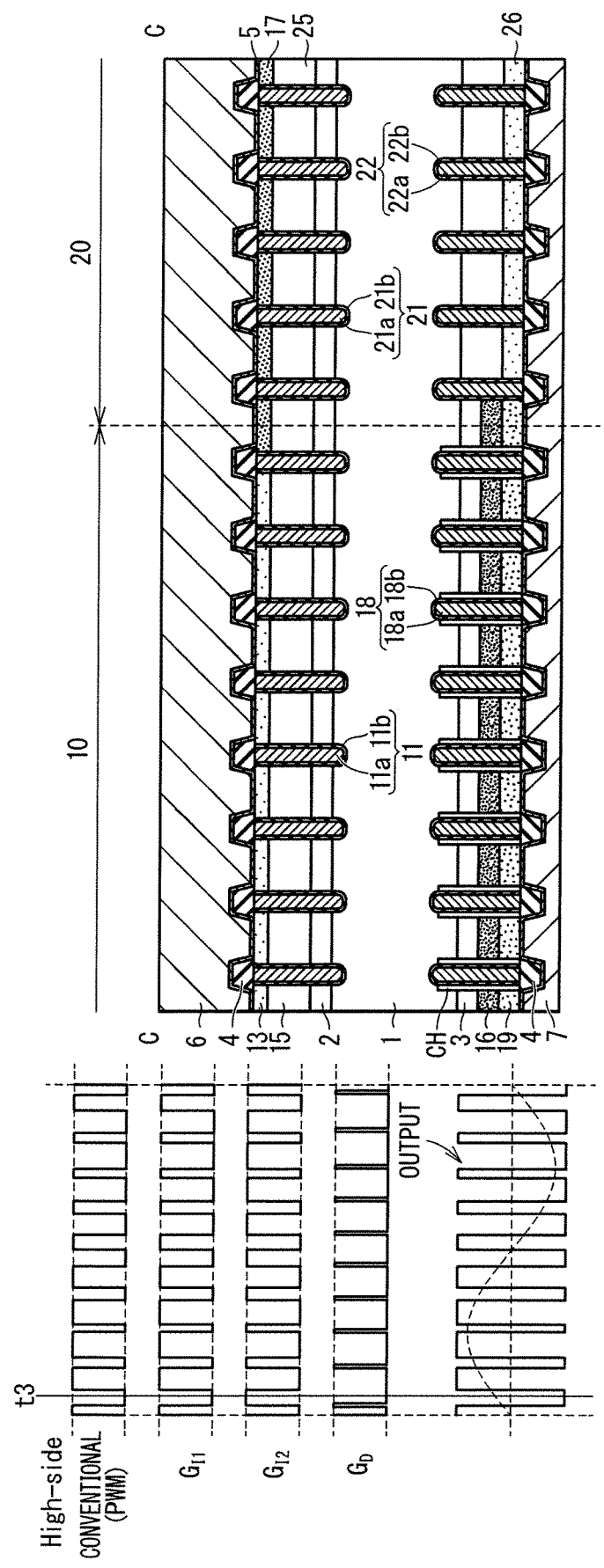
FIG. 35 illustrates the control in the inverter circuit according to Embodiment 3.

FIG. 35 illustrates a carrier state in the RC-IGBT 100B in the right diagram, at a time t3 in the timing chart in the left diagram. At the time t3, the IGBT region 10 does not conduct. Since gates other than the active trench gates 18 are OFF, injection of holes ceases, and the IGBT region 10 does not conduct. The turn off loss in the aforementioned IGBT mode decreases more significantly than those of the conventional RC-IGBTs. This mechanism for significantly reducing the turn off loss applies to the structure of the inverter circuit IV2 according to Embodiment 2.

Figure 36:
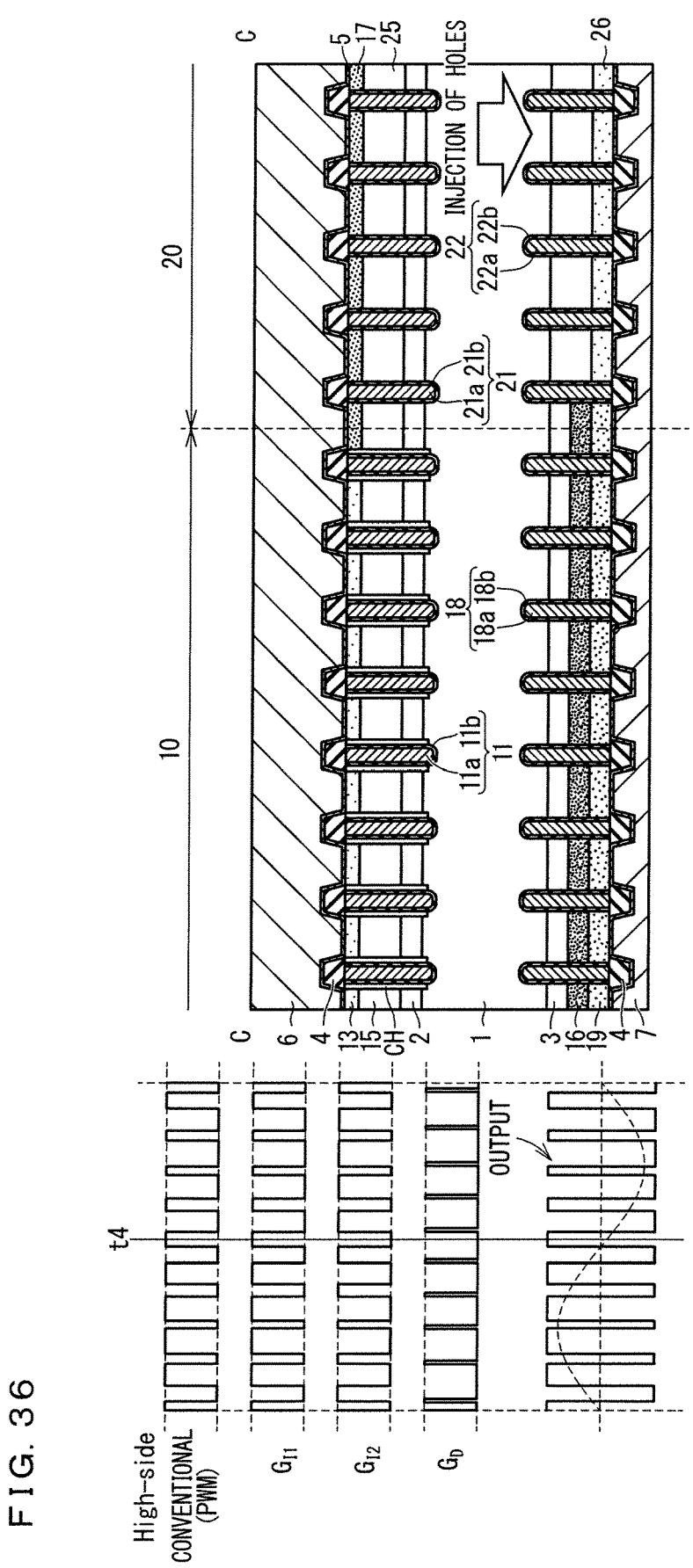
FIG. 36 illustrates the control in the inverter circuit according to Embodiment 3.

FIG. 36 illustrates a carrier state in the RC-IGBT 100B in the right diagram, at a time t4 in the timing chart in the left diagram. At the time t4, the diode region 20 is brought into reverse conduction. The active trench gates 11 in the IGBT region 10 are ON but are distant from the diode region 20. Thus, injection of holes from the emitter electrode 6 brings the diode region 20 into reverse conduction.

Figure 37:
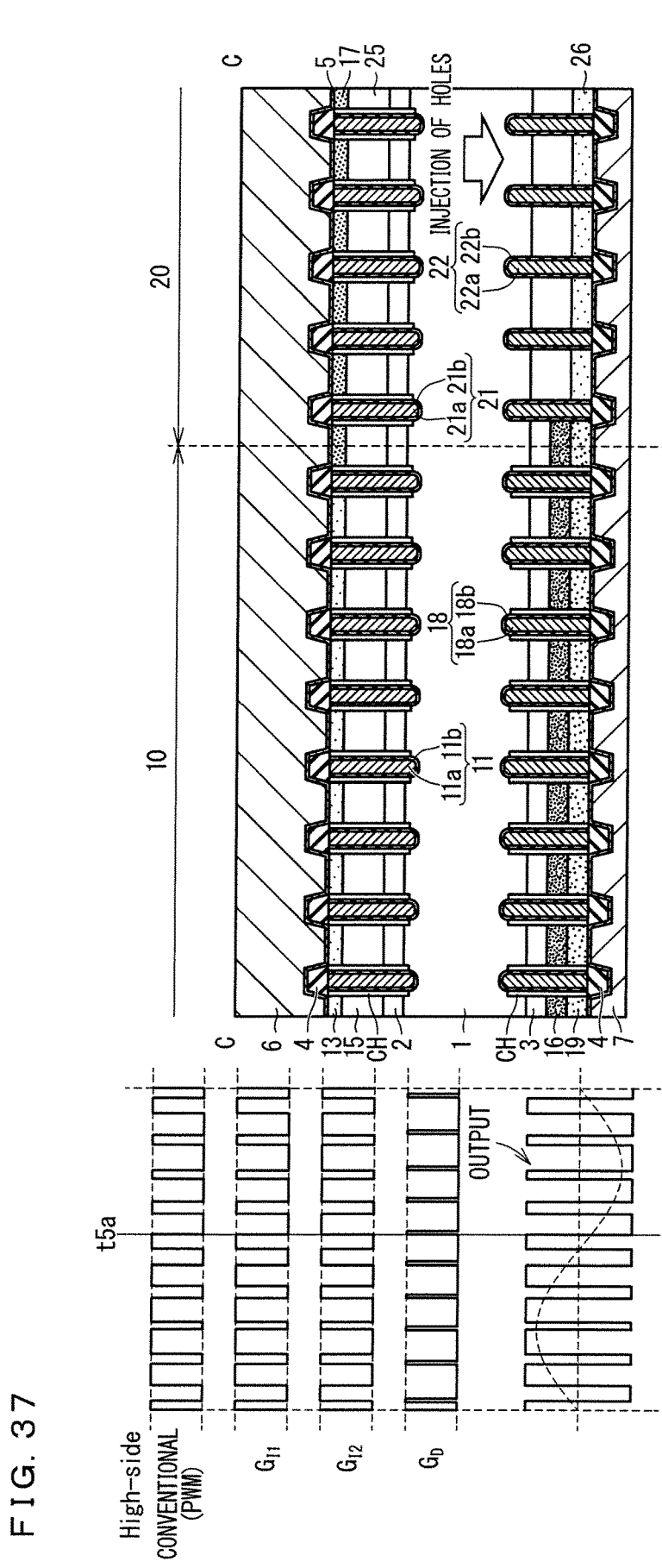
FIG. 37 illustrates the control in the inverter circuit according to Embodiment 3.

FIG. 37 illustrates a carrier state in the RC-IGBT 100B in the right diagram, at a time t5a in the timing chart in the left diagram. At the time t5a, the reverse recovery of the diode region 20 is prepared. Since the diode trench gates 21 are ON, the amount of injected holes in the diode region 20 decreases.

Figure 38:
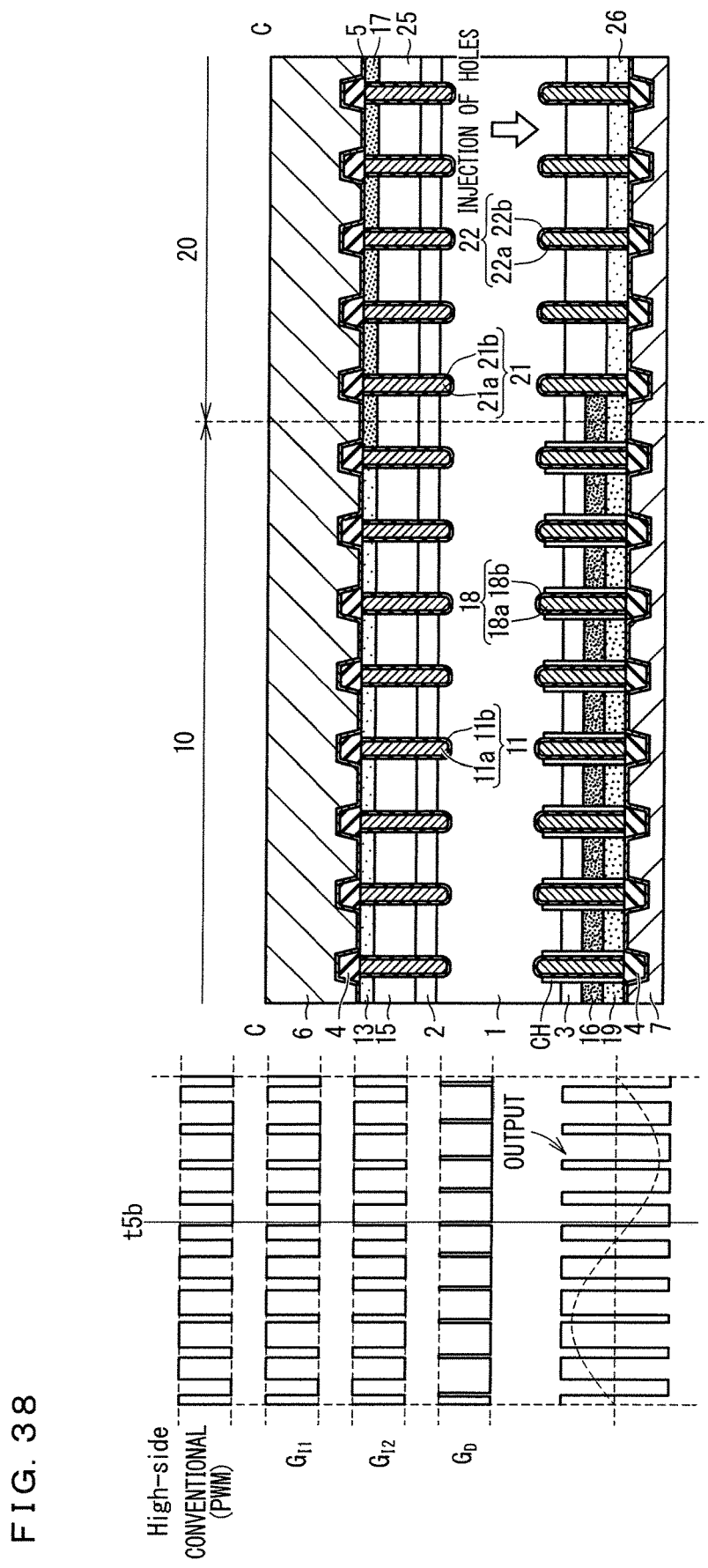
FIG. 38 illustrates the control in the inverter circuit according to Embodiment 3.

FIG. 38 illustrates a carrier state in the RC-IGBT 100B in the right diagram, at a time t5b in the timing chart in the left diagram. The time t5b is a reverse recovery time of the diode region 20. Turning ON the IGBT region 10 that is an opposite arm of the diode region 20 reverse recovers the diode region 20. Here, the amount of injected holes is reduced, and internal carriers are less. Thus, the reverse recovery loss decreases.

Figure 39:
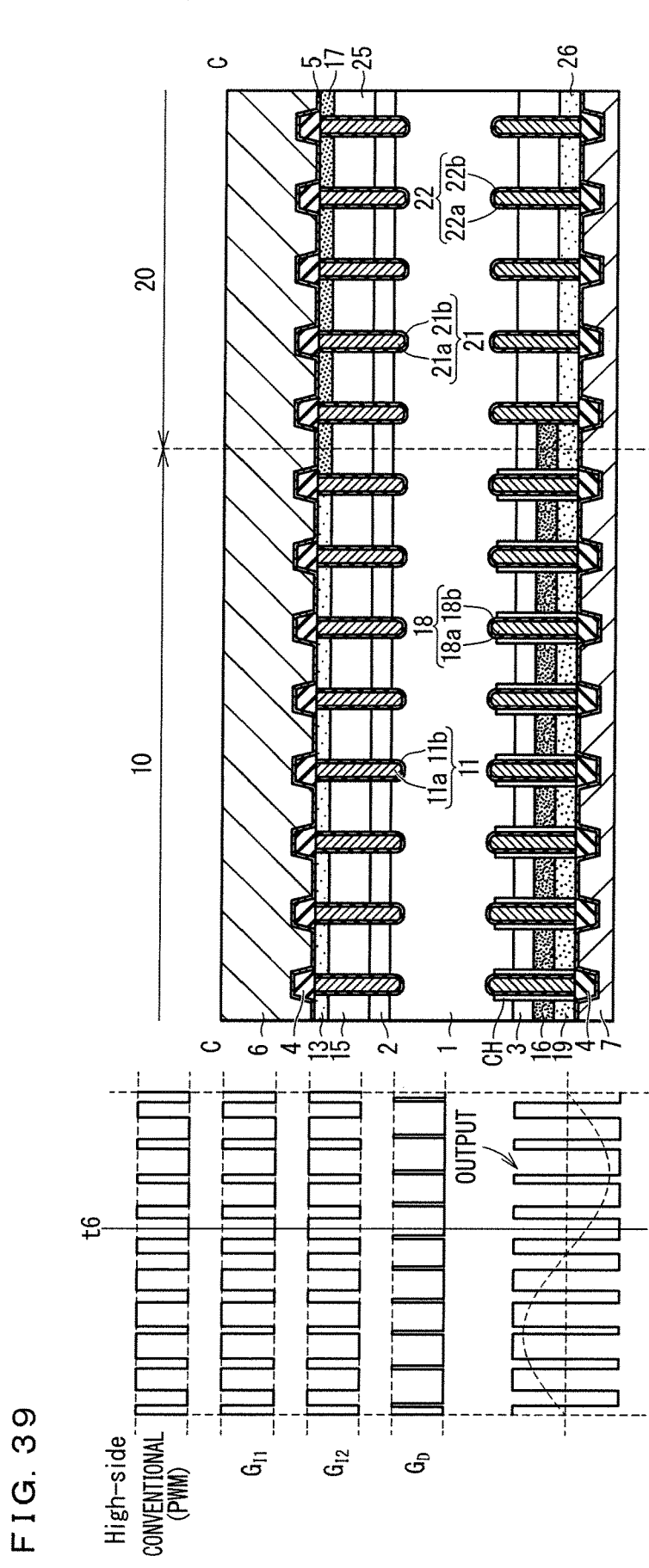
FIG. 39 illustrates the control in the inverter circuit according to Embodiment 3.

FIG. 39 illustrates a carrier state in the RC-IGBT 100B in the right diagram, at a time t6 in the timing chart in the left diagram. At the time t6, the diode region 20 does not conduct. Since a voltage is applied in a current blocking direction for a diode, the diode region 20 does not conduct.

In the aforementioned diode mode, the reverse recovery loss decreases more significantly than those of the conventional RC-IGBTs.

As such, the RC-IGBT 100B is controlled in both of the IGBT mode and the diode mode in the inverter circuit IV3 according to Embodiment 3. Thus, the turn off loss and the reverse recovery loss significantly decrease.

[Specific Example of Timing Charts]

Figure 40:
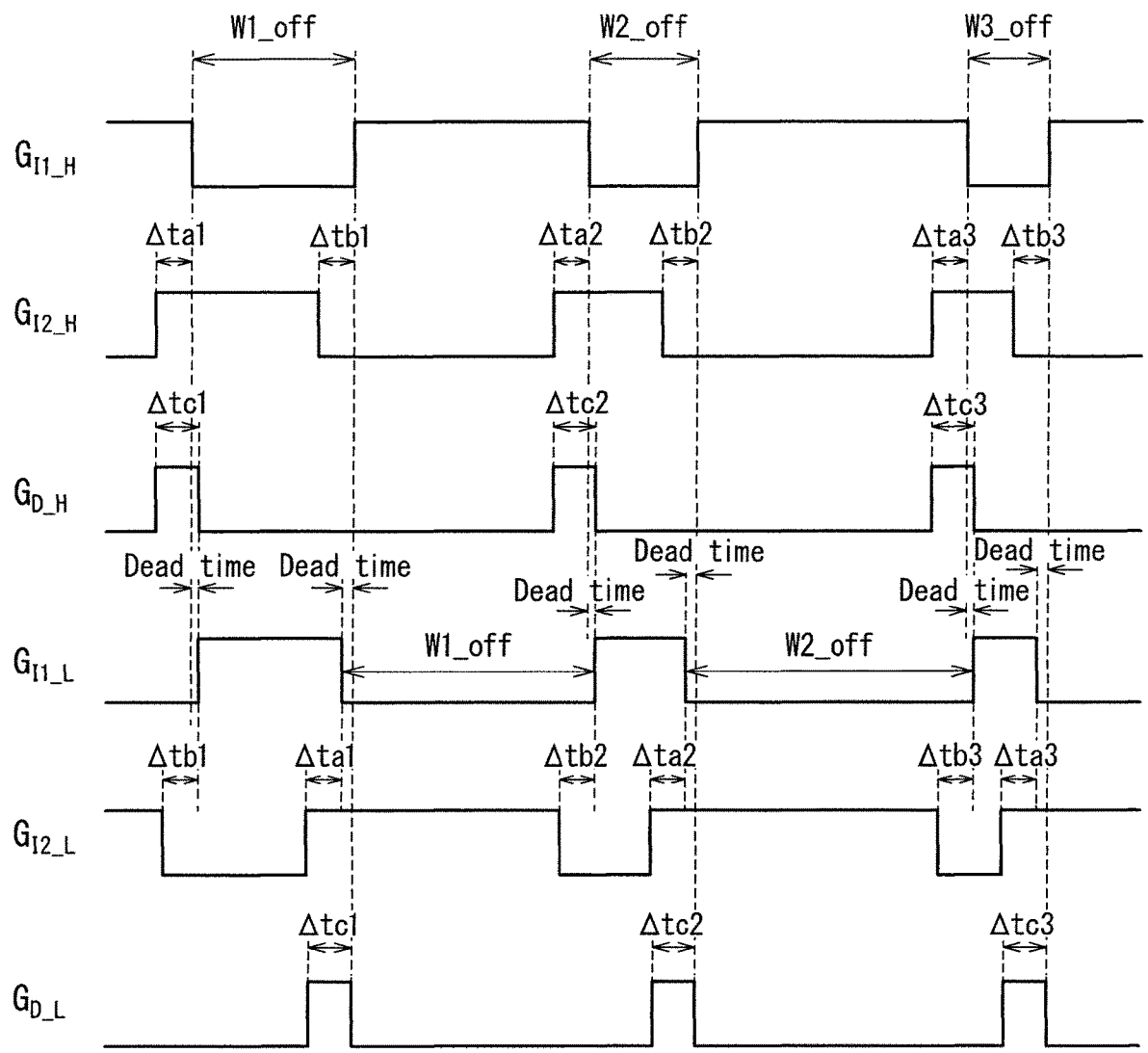
FIG. 40 illustrates specific timing charts for controlling the RC-IGBTs in Embodiments 1 to 3.

Next, FIG. 40 illustrates a specific example of timing charts for controlling the RC-IGBTs in Embodiments 1 to 3. Since the RC-IGBT 100 in Embodiment 1 does not include the active trench gates 18, a timing chart excluding the gate signals $G_{f2\_H}$ and $G_{f2\_L}$ is applied to the RC-IGBT 100. A timing chart excluding the gate signals $G_{D\_H}$ and $G_{D\_L}$ is applied to the RC-IGBT 100A in Embodiment 2.

FIG. 40 illustrates the timing charts of the gate signals $G_{f1\_H}$, $G_{f2\_H}$, $G_{D\_H}$, $G_{f1\_L}$, $G_{f2\_L}$, and $G_{D\_L}$ in order from the top. In FIG. 40, other gate signals are generated with respect to the gate signal $G_{f1\_H}$. For example, the active trench gates 18 are turned OFF in a period Δtb during an off period (Wn_off) of the active trench gates 11 that are main gates. The gate signal $G_{f2\_H}$ is generated in a period Δta so that the active trench gates 18 are turned ON before the active trench gates 11 are OFF.

Here, definition of the periods in FIG. 40 will be described. The period Δta is a period from a time at which the active trench gates 18 are ON with respect to a potential of the collector electrode 7 that is the second main electrode in the IGBT regions to a time at which the active trench gates 11 are OFF with respect to a potential of the emitter electrode 6 that is the first main electrode in the IGBT regions.

The period Δtb is a period from a time at which the active trench gates 18 are OFF with respect to the potential of the collector electrode 7 in the IGBT regions to a time at which the active trench gates 11 are ON with respect to the potential of the emitter electrode 6 in the IGBT regions.

The period Δtc is a period from a time at which the diode trench gates 21 are ON with respect to the potential of the emitter electrode 6 functioning as an anode electrode in the diode regions to a time at which the diode trench gates 11 are OFF with respect to the potential of the emitter electrode 6 in the IGBT regions in the opposite arm and the diode trench gates 21 are OFF with respect to the potential of the emitter electrode 6 in the diode regions. When the dead time is short in the period Δtc, synchronizing the diode trench gates 21 with the timing at which an IGBT in the same arm is OFF expectedly produces an advantage of sufficiently reducing losses.

When the periods Δta and Δtc are too long, the conduction loss increases. Thus, the periods Δta and Δtc are preferably 20 microseconds (μs) or less, or 20 μs at a maximum so that the conduction losses in the IGBT regions and the diode regions are maintained within acceptable limits.

Based on this, the magnitude relationship between the periods Δta, Δtb, Δtc, and Wn_off are represented by 20 μs≥Δta≥0, Wn_off≥Δtb≥0, and 20 μs≥Δtc≥0.

During a period in which the active trench gates 11 that are main gates are OFF, a leakage current is less. However, when a period in which the active trench gates 18, namely, sub-gates are ON overlaps a period in which the active trench gates 11 are ON, the turn-on loss increases. Thus, the turn-on loss is adjusted by the period Δtb.

[Summary of Gate Control]

FIG. 41 illustrates, as a list, the gate control on the RC-IGBT 100B according to Embodiment 3. FIG. 41 illustrates modes at the respective times in FIGS. 32 to 38, and voltages of the gate signals in the modes. In FIG. 41, "V" denotes any voltage, "Vc" denotes a collector voltage, and "Ve" denotes an emitter voltage.

The present disclosure enables low-loss operations of an RC-IGBT with a plurality of gates under the same control, irrespective of directions of currents as illustrated in FIG. 41.

As described in detail above, the advantages described in the Description can be produced, irrespective of whether the IGBT regions 10 or the diode regions 20 are arranged to have an island geometry or a stripe geometry, whether gates are trenches or planar gates, or the presence or absence of dummy gates.

[Other Applications]

The semiconductor device according to the present disclosure can expectedly produce an advantage of reducing losses in an RC-IGBT, irrespective of dimensions of an isolated region between the IGBT region 10 and the diode region 20, or even in the absence of the isolated region. The active trench gates 18 reach the n⁻ type drift layer 1 through the n-type buffer layer 3 in Embodiments 1 to 4. The active trench gates 18 are not limited to these. The active trench gates 18 whose ends are located in the n-type buffer layer 3 also produces the advantage of reducing losses in the RC-IGBT.

Embodiments 1 to 4 describe, as a semiconductor device according to the present disclosure, an example RC-IGBT in which IGBT regions and diode regions are formed on the same semiconductor substrate. The RC-IGBT exhibits high heat dissipation and increase in the productivity of modules as well as reduction in losses as described above.

The present disclosure is applicable to a structure in which the IGBT regions 10 and the diode regions 20 are formed on separate semiconductor substrates as an IGBT chip and a diode chip, respectively, and the diode chip is connected in anti-parallel to the IGBT chip. This structure produces the same advantages as those of the RC-IGBTs. Moreover, application of the separate chips facilitates the control without any interaction between the IGBT chip and the diode chip in reducing losses. The IGBT chip can be replaced with a MOSFET chip.

Embodiments according to the present disclosure can be freely combined, and appropriately modified or omitted.

The aforementioned present disclosure will be described as Appendixes as a summary.

[Appendix 1] A semiconductor device, comprising
a first switching device and a second switching device that are connected in series between a first potential and a second potential lower than the first potential,
wherein each of the first and second switching devices includes a transistor region, and a diode region electrically connected in anti-parallel to the transistor region,
the transistor region includes a first gate controlled by a first gate signal, and
the diode region includes a diode gate controlled by a diode gate signal.

[Appendix 2] A semiconductor device, comprising
a first switching device and a second switching device that are connected in series between a first potential and a second potential lower than the first potential,
wherein each of the first and second switching devices includes a transistor region, and a diode region electrically connected in anti-parallel to the transistor region, and
the transistor region includes a first gate controlled by a first gate signal, and a second gate controlled by a second gate signal.

[Appendix 3] A semiconductor device, comprising
a first switching device and a second switching device that are connected in series between a first potential and a second potential lower than the first potential,
wherein each of the first and second switching devices includes a transistor region, and a diode region electrically connected in anti-parallel to the transistor region, and
the transistor region includes a first gate controlled by a first gate signal, and a second gate controlled by a second gate signal, and
the diode region includes a diode gate controlled by a diode gate signal.

[Appendix 4] The semiconductor device according to any one of appendixes 1 to 3,
wherein the transistor region and the diode region are formed in a same semiconductor substrate.

[Appendix 5] The semiconductor device according to any one of appendixes 1 to 3,
wherein the transistor region and the diode region are formed in separate semiconductor substrates.

[Appendix 6] A method for controlling the semiconductor device according to appendix 1, the method comprising:
applying a positive voltage to the diode gate in the diode region in the second switching device as the diode gate signal to turn ON the diode gate, with a second timing earlier than a first timing at which a positive voltage is applied to the first gate in the first switching device as the first gate signal to turn ON the transistor region; and
setting the diode gate signal to a negative voltage or a zero voltage with the first timing or a timing earlier than the first timing to turn OFF the diode gate in the diode region in the second switching device.

[Appendix 7] A method for controlling the semiconductor device according to appendix 2,
wherein the transistor region is disposed between a first main electrode and a second main electrode that are electrically separated from each other,
the first gate signal is a signal with respect to the first potential of the first main electrode, and
the second gate signal is a signal with respect to the second potential of the second main electrode,
the method comprising:
applying a positive voltage to the second gate as the second gate signal to turn ON the second gate, with a second timing earlier than a first timing at which a negative voltage or a zero voltage is applied to the first gate as the first gate signal to turn OFF the transistor region; and
setting the second gate signal to the negative voltage or the zero voltage to turn OFF the second gate between the first timing and a third timing at which a positive voltage is applied to the first gate in the first switching device as the first gate signal to turn ON the transistor region.

[Appendix 8] A method for controlling the semiconductor device according to appendix 3, the method comprising:
wherein the transistor region is disposed between a first main electrode and a second main electrode that are electrically separated from each other, the first gate signal is a signal with respect to the first potential of the first main electrode, and the second gate signal is a signal with respect to the second potential of the second main electrode, the method comprising:

applying a positive voltage to the second gate in the first switching device as the second gate signal to turn ON the second gate, with a second timing earlier than a first timing at which a negative voltage or a zero voltage is applied to the first gate as the first gate signal to turn OFF the transistor region;

setting the second gate signal to the negative voltage or the zero voltage to turn OFF the second gate between the first timing and a third timing at which a positive voltage is applied to the first gate in the first switching device as the first gate signal to turn ON the transistor region;

applying a positive voltage to the diode gate in the diode region in the second switching device as the diode gate signal to turn ON the diode gate with a fourth timing earlier than the third timing at which the transistor region is turned ON; and setting the diode gate signal to the negative voltage or the zero voltage with the third timing or a timing earlier than the third timing to turn OFF the diode gate in the diode region in the second switching device.

[Appendix 9] The method according to any one of appendixes 6 to 8, wherein the second timing is earlier than the first timing by 20 microseconds at a maximum.

[Appendix 10] The method according to appendix 8, wherein the fourth timing is earlier than the third timing by 20 microseconds at a maximum.

While the invention has been shown and described in detail, the foregoing description is in all aspects illustrative and not restrictive. It is therefore understood that numerous modifications and variations can be devised without departing from the scope of the invention.

What is claimed is:

1. A method for controlling a semiconductor device, the semiconductor device comprising:

a first switching device and a second switching device that are connected in series between a first potential and a second potential lower than the first potential, wherein each of the first and second switching devices includes a transistor region, and a diode region electrically connected in anti-parallel to the transistor region, the transistor region includes a first gate controlled by a first gate signal, and the diode region includes a diode gate controlled by a diode gate signal, the method comprising:

applying a positive voltage to the diode gate in the diode region in the second switching device as the diode gate signal to turn ON the diode gate, with a second timing earlier than a first timing at which a positive voltage is applied to the first gate in the first switching device as the first gate signal to turn ON the transistor region; and setting the diode gate signal to a negative voltage or a zero voltage with the first timing or a timing earlier than the first timing to turn OFF the diode gate in the diode region in the second switching device, wherein the second timing is earlier than the first timing by 20 microseconds at a maximum.

2. A method for controlling a semiconductor device, the semiconductor device comprising:

a first switching device and a second switching device that are connected in series between a first potential and a second potential lower than the first potential, wherein each of the first and second switching devices includes a transistor region, and a diode region electrically connected in anti-parallel to the transistor region, the transistor region includes a first gate controlled by a first gate signal, and a second gate controlled by a second gate signal, the transistor region is disposed between a first main electrode and a second main electrode that are electrically separated from each other, the first gate signal is a signal with respect to the first potential of the first main electrode, and the second gate signal is a signal with respect to the second potential of the second main electrode, the method comprising:

applying a positive voltage to the second gate as the second gate signal to turn ON the second gate, with a second timing earlier than a first timing at which a negative voltage or a zero voltage is applied to the first gate as the first gate signal to turn OFF the transistor region; and setting the second gate signal to the negative voltage or the zero voltage to turn OFF the second gate between the first timing and a third timing at which a positive voltage is applied to the first gate in the first switching device as the first gate signal to turn ON the transistor region.

3. The method according to claim 2, wherein the second timing is earlier than the first timing by 20 microseconds at a maximum.

4. A method for controlling a semiconductor device, the semiconductor device comprising:

a first switching device and a second switching device that are connected in series between a first potential and a second potential lower than the first potential, wherein each of the first and second switching devices includes a transistor region, and a diode region electrically connected in anti-parallel to the transistor region, the transistor region includes a first gate controlled by a first gate signal, and a second gate controlled by a second gate signal, the diode region includes a diode gate controlled by a diode gate signal, the transistor region is disposed between a first main electrode and a second main electrode that are electrically separated from each other, the first gate signal is a signal with respect to the first potential of the first main electrode, and the second gate signal is a signal with respect to the second potential of the second main electrode, the method comprising:

applying a positive voltage to the second gate in the first switching device as the second gate signal to turn ON the second gate, with a second timing earlier than a first timing at which a negative voltage or a zero voltage is applied to the first gate as the first gate signal to turn OFF the transistor region;

setting the second gate signal to the negative voltage or the zero voltage to turn OFF the second gate between the first timing and a third timing at which a positive voltage is applied to the first gate in the first switching device as the first gate signal to turn ON the transistor region;

applying a positive voltage to the diode gate in the diode region in the second switching device as the diode gate signal to turn ON the diode gate with a fourth timing earlier than the third timing at which the transistor region is turned ON; and setting the diode gate signal to the negative voltage or the zero voltage with the third timing or a timing earlier than the third timing to turn OFF the diode gate in the diode region in the second switching device.

5. The method according to claim 4,
wherein the second timing is earlier than the first timing by 20 microseconds at a maximum.

6. The method according to claim 4,
wherein the fourth timing is earlier than the third timing by 20 microseconds at a maximum.

* * * * *